United States Patent
Hubert et al.

(10) Patent No.: US 7,250,632 B2
(45) Date of Patent: Jul. 31, 2007

(54) ELECTRONIC DEVICES HAVING A LAYER OVERLYING AN EDGE OF A DIFFERENT LAYER AND A PROCESS FOR FORMING THE SAME

(75) Inventors: Matthew Dewey Hubert, Goleta, CA (US); Matthew Stevenson, Santa Maria, CA (US); Patrick Hahn, Cupertino, CA (US); Frank P. Uckert, Buellton, CA (US); Gang Yu, Santa Barbara, CA (US)

(73) Assignees: E. I. du Pont de Nemours and Company, Wilmington, DE (US); DuPont Displays, Inc., Santa Barbara, CA (US)

( * ) Notice: Subject to any disclaimer, the term of this patent is extended or adjusted under 35 U.S.C. 154(b) by 0 days.

(21) Appl. No.: 11/088,164

(22) Filed: Mar. 23, 2005

(65) Prior Publication Data
US 2005/0248261 A1 Nov. 10, 2005

Related U.S. Application Data

(60) Provisional application No. 60/559,916, filed on Apr. 6, 2004.

(51) Int. Cl.
H01L 33/00 (2006.01)
(52) U.S. Cl. .............................. 257/79; 257/80; 257/88; 257/E33.001
(58) Field of Classification Search ............ 257/79–81, 257/88, 91, 89, E31.001, E33.001
See application file for complete search history.

(56) References Cited

U.S. PATENT DOCUMENTS

| | | | |
|---|---|---|---|
| 4,356,429 A | 10/1982 | Tang | |
| 4,539,507 A | 9/1985 | VanSlyke et al. | |
| 5,247,180 A | 9/1993 | Friend et al. | |
| 5,317,169 A | 5/1994 | Nakano et al. | |
| 5,408,109 A | 4/1995 | Heeger et al. | |
| 6,420,251 B1* | 7/2002 | Elmadjian et al. | 438/597 |
| 6,503,831 B2* | 1/2003 | Speakman | 438/674 |
| 6,909,124 B2 | 6/2005 | Murakami | |
| 2002/0060518 A1 | 5/2002 | Duineveld et al. | |
| 2003/0048822 A1* | 3/2003 | Nakatsu et al. | 372/43 |
| 2006/0118798 A1* | 6/2006 | Lee | 257/88 |

\* cited by examiner

*Primary Examiner*—T. N. Quach
(74) *Attorney, Agent, or Firm*—John H. Lamming

(57) ABSTRACT

An electronic device includes a radiation-emitting component, a radiation-responsive component, or a combination thereof. In one embodiment, the electronic device includes a substrate and a first structure overlying the substrate. The electronic device also includes a second structure that includes a first layer, wherein the first layer has a first refractive index, and the first layer includes a first edge. The electronic device further includes a second layer overlying at least portions of the first structure and the second structure at the first edge. The second layer has a second refractive index that is lower than the first refractive index. In another embodiment, the first structure includes a layer having a perimeter and a pattern lying within the perimeter. The pattern extends at least partly though the first layer to define an opening with a first edge. In another embodiment, a process is used to form the electronic device.

13 Claims, 12 Drawing Sheets

ELECTRONIC DEVICES HAVING A LAYER OVERLYING AN EDGE OF A DIFFERENT LAYER AND A PROCESS FOR FORMING THE SAME

FIELD OF THE INVENTION

The invention relates generally to electronic devices and processes, and more specifically to electronic devices having layers overlying edges of other layers and processes for forming those devices.

BACKGROUND INFORMATION

Many electronic devices are designed to emit or respond to radiation. Examples of electronic devices include Organic Light Emitting Diodes (OLEDs). OLEDs are promising for display applications due to their high power conversion efficiency and low processing costs. OLEDs include organic active layers that can emit or respond to the radiation.

A waveguide (also called a "light pipe") may be formed within an electronic device at an interface between layers having dissimilar refractive indices. The waveguide effect can occur when radiation propagating within a layer having a higher refractive index is reflected at an interface with another layer having a lower refractive index. The waveguide effect can cause radiation to propagate laterally as opposed to propagating towards the user of the electronic device. In electronic devices, the lateral propagation of radiation can reduce the efficiency of the electronic device (require more power for a desired level of intensity), increase optical cross talk between pixels, or a combination thereof. Conventional wisdom within the art is to reduce or eliminate the waveguide effect as much as possible.

SUMMARY OF THE INVENTION

An electronic device includes a radiation-emitting component, a radiation-responsive component, or a combination thereof. In a first aspect, the electronic device includes a substrate and a first structure overlying the substrate, wherein the first structure is an electrically active structure. The electronic device also includes a second structure overlying at least portions of the first structure and the substrate. The second structure includes a first layer, the first layer has a first refractive index, and the first layer includes a first edge. The electronic device further includes a second layer overlying at least portions of the first structure and the second structure. The second layer has a second refractive index that is lower than the first refractive index, and the second layer includes a first portion and a second portion. The first portion of the second layer overlies both the first structure at the first edge and the second structure, and the second portion of the second layer overlies the first structure but not the second structure.

In a second aspect, an electronic device includes a substrate, and a first structure overlying the substrate. The first structure includes a first layer having a perimeter and a pattern lying within the perimeter, and the pattern extends at least partly though the first layer to define an opening with a first edge. The electronic device also includes a second structure overlying the opening and at least portions of the first structure and the substrate. The second structure includes a second layer that includes a second edge. The electronic device still further includes a third layer overlying at least portions of the first structure and the second structure. The third layer includes a first portion and a second portion, the first portion of the third layer overlies the first structure and the second structure at the second edge, and the second portion of the third layer overlies the first structure but not the second structure.

In a third aspect, a process for forming an electronic device includes forming a first structure over a substrate, wherein the first structure is an electrically active structure. The process also includes forming a second structure over at least portions of the first structure and the substrate. The second structure includes a first layer, the first layer has a first refractive index, and the first layer includes a first edge. The process further includes forming a second layer overlying the first structure and the second structure. The second layer has a second refractive index that is lower than the first refractive index, the second layer includes a first portion and a second portion, the first portion of the second layer overlies the first structure at the first edge of the first layer and overlies the second structure, and the second portion of the second layer overlies the first structure but not the second structure.

The foregoing general description and the following detailed description are exemplary and explanatory only and are not restrictive of the invention, as defined in the appended claims.

BRIEF DESCRIPTION OF THE DRAWINGS

The invention is illustrated by way of example and not limitation in the accompanying figures.

Figure 1:
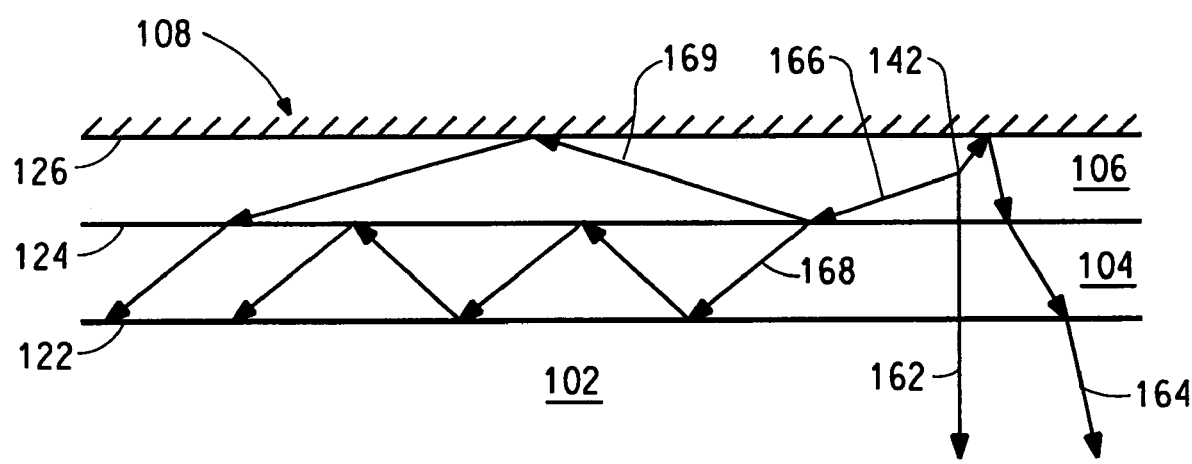
FIG. 1 includes an illustration showing how radiation from an emission site may propagate through different layers within an electronic device.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

An electronic device includes a radiation-emitting component, a radiation-responsive component, or a combination thereof. In a first aspect, the electronic device includes a substrate and a first structure overlying the substrate, wherein the first structure is an electrically active structure. The electronic device also includes a second structure overlying at least portions of the first structure and the substrate. The second structure includes a first layer, the first layer has a first refractive index, and the first layer includes a first edge. The electronic device further includes a second layer overlying at least portions of the first structure and the second structure. The second layer has a second refractive index that is lower than the first refractive index, and the second layer includes a first portion and a second portion. The first portion of the second layer overlies both the first structure at the first edge and the second structure, and the second portion of the second layer overlies the first structure but not the second structure.

In one embodiment of the first aspect, the second structure includes a well structure. In another embodiment, the first structure further includes a third layer having a third refractive index. A first difference is an absolute value of the first refractive index minus the second refractive index, a second difference is an absolute value of the first refractive index minus the third refractive index, and the first difference is larger than the second difference. In a particular embodiment, the first refractive index and the third refractive index are substantially the same.

In another particular embodiment, the substrate includes a fourth layer having a fourth refractive index, and the fourth layer is optically coupled to the first layer, the second layer, and the third layer. In a more particular embodiment, a third difference is an absolute value of the first refractive index minus the fourth refractive index, and the third difference is larger than the second difference. In another more particular embodiment, the third refractive index has a value that is 90 to 110% of the first refractive index, and each of the second and fourth refractive indices is less than 90% of the first refractive index. In still another more particular embodiment, each of the first and third refractive indices has a value in a range of approximately 1.8 to 3.0, and each of the second and fourth refractive indices has a value in a range of approximately 1.4 to 1.8.

In still another embodiment of the first aspect, the first structure has a second edge, wherein the first layer overlies the second edge. In a particular embodiment, the first edge of the second structure includes a receding edge, wherein the receding edge overlies the second edge of the first structure.

In a further embodiment of the first aspect, the first structure includes an electrode for the electronic device. In another further embodiment, the second layer includes an organic active layer. In still another further embodiment, the electronic device includes a display, wherein the first layer, the first edge, and the second layer lie within an array of the display. In yet another further embodiment, the second structure does not have an upper portion that is spaced apart and overhangs a lower portion of the second structure, wherein the lower portion lies between the upper portion and the substrate.

In a second aspect, an electronic device includes a substrate, and a first structure overlying the substrate. The first structure includes a first layer having a perimeter and a pattern lying within the perimeter, and the pattern extends at least partly though the first layer to define an opening with a first edge. The electronic device also includes a second structure overlying the opening and at least portions of the first structure and the substrate. The second structure includes a second layer that includes a second edge. The electronic device still further includes a third layer overlying at least portions of the first structure and the second structure. The third layer includes a first portion and a second portion, the first portion of the third layer overlies the first structure and the second structure at the second edge, and the second portion of the third layer overlies the first structure but not the second structure.

In one embodiment of the second aspect, the first structure includes an electrode. In a particular embodiment, the second structure includes a well structure.

In another embodiment of the second aspect, the first layer has a first refractive index, the second layer has a second refractive index, and the third layer has a third refractive index. A first difference is an absolute value of the first refractive index minus the second refractive index, and a second difference is an absolute value of the first refractive index minus the third refractive index. The first difference is larger than the second difference. In a particular embodiment, the first refractive index and the third refractive index are substantially the same. In another particular embodiment, each of the first and third refractive indices has a value in a range of approximately 1.8 to 3.0, and the second refractive index has a value in a range of approximately 1.4 to 1.8.

In still another embodiment of the second aspect, the third layer overlies the first edge. In a further embodiment, the second edge of the second structure includes a receding edge, wherein the receding edge overlies the first edge of the first structure. In another further embodiment, the third layer includes an organic active layer. In still another further embodiment, the electronic device includes a display, wherein the first structure, first edge, second structure, the second edge, and the third layer lie within an array of the display.

In a third aspect, a process for forming an electronic device includes forming a first structure over a substrate, wherein the first structure is an electrically active structure. The process also includes forming a second structure over at least portions of the first structure and the substrate. The second structure includes a first layer, the first layer has a first refractive index, and the first layer includes a first edge. The process further includes forming a second layer overlying the first structure and the second structure. The second layer has a second refractive index that is lower than the first refractive index, the second layer includes a first portion and a second portion, the first portion of the second layer overlies the first structure at the first edge of the first layer and overlies the second structure, and the second portion of the second layer overlies the first structure but not the second structure.

In one embodiment of the third aspect, forming the second structure includes depositing the first layer, and patterning the first layer, wherein the first edge includes a receding edge after patterning. In another embodiment, forming the second structure includes deposing the first layer using a precision deposition technique, such that the second structure is formed as the first layer is deposited.

In still another embodiment of the third aspect, the first structure includes a third layer lying between a user side of the electronic device and each of the second structure and the second layer. In a particular embodiment, the third layer has a third refractive index. A first difference is an absolute value of the first refractive index minus the second refractive index, a second difference is an absolute value of the first refractive index minus the third refractive index, and the first difference is larger than the second difference. In another particular embodiment, the first refractive index and the third refractive index are substantially the same. In still another particular embodiment, the first structure includes an electrode, and the second structure includes a well structure. In a further particular embodiment, each of the first and third refractive indices has a value in a range of approximately 1.8 to 3.0, and the second refractive index has a value in a range of approximately 1.4 to 1.8.

In a further embodiment of the third aspect, the second layer includes an organic active layer. In another further embodiment, the second structure does not have an upper portion that is spaced apart and overhangs a lower portion of the second structure, wherein the lower portion lies between the upper portion and the substrate.

Other features and advantages of the invention will be apparent from the following detailed description, and from the claims. The detailed description first addresses Definitions and Clarification of Terms followed by Refraction, Reflection, and Waveguides, Halo Effect, Fabrication Process, Device Operation and Halo Effect, Other Shapes and Patterns, Other Embodiments, Advantages, and finally Examples.

1. Definitions and Clarification of Terms

Before addressing details of embodiments described below, some terms are defined or clarified.

The term "active" when referring to a layer or material is intended to mean a layer or material that exhibits electro-radiative or electromagnetic properties. An active layer material may emit radiation or exhibit a change in concentration of electron-hole pairs when receiving radiation.

The terms "array," "peripheral circuitry," and "remote circuitry" are intended to mean different areas or components of an electronic device. For example, an array may include pixels, cells, or other structures within an orderly arrangement (usually designated by columns and rows). The pixels, cells, or other structures within the array may be controlled locally by peripheral circuitry, which may lie on the same substrate as the array but outside the array itself. Remote circuitry typically lies away from the peripheral circuitry and can send signals to or receive signals from the array (typically via the peripheral circuitry). The remote circuitry may also perform functions unrelated to the array. The remote circuitry may or may not reside on the substrate having the array.

The term "buffer layer" or "buffer material" is intended to mean electrically conductive or semiconductive materials that may have one or more functions in an organic electronic device, including but not limited to, planarization of the underlying layer, charge transport and/or charge injection properties, scavenging of impurities such as oxygen or metal ions, and other aspects to facilitate or to improve the performance of the organic electronic device. Buffer Materials may be polymers, solutions, dispersions, suspensions, emulsions, colloidal mixtures, or other compositions.

The term "charge-blocking," when referring to a layer, material, member, or structure, is intended to mean such layer, material, member or structure reduces the likelihood that a charge migrates into another layer, material, member or structure.

The term "charge carrier," with respect to an electronic component or circuit, is intended to mean the smallest unit of charge. Charge carriers can include n-type charge carriers (e.g., electrons or negatively charged ions), p-type charge carriers (e.g., holes or positively charged ions), or any combination thereof.

The term "charge-injecting," when referring to a layer, material, member, or structure, is intended to mean such layer, material, member or structure promotes charge migration into an adjacent layer, material, member or structure.

The term "charge-transport," when referring to a layer, material, member, or structure is intended to mean such layer, material, member, or structure facilitates migration of such charge through the thickness of such layer, material, member, or structure with relative efficiency and small loss of charge. [see "electron transport", "hole transport."]

The term "electrically active structure" is intended to mean a structure within a radiation-emitting component, a radiation-responsive component, or a combination thereof, wherein such structure is designed such that a significant amount of charge carriers flow through, into, or out of such structure during normal operation of such radiation-emitting component, radiation-responsive component, or combination thereof. An example of an electrically active structure includes an anode, a cathode, a portion of an organic active layer, a buffer layer, a charge-blocking layer, a charge-injecting layer, a charge-transport layer, or any combination thereof.

The term "environmental protection structure" is intended to mean a structure that substantially protects a portion of an electronic device from damage originating from a source external to the electronic device. An example of an environmental protection structure includes a substrate, a lid attached to the substrate, or a combination thereof.

The term "layer" refers to a film covering a desired area. The area can be as large as an entire display, or as small as a specific functional area, such as a single sub-pixel. A layer can be made from one or more organic or inorganic materials or mixtures thereof.

The term "organic active layer" is intended to mean one or more organic layers, wherein at least one of the organic layers, by itself, or when in contact with a dissimilar material is capable of forming a rectifying junction.

The term "over-hanging projection" is intended to mean a portion of a structure overlying a substrate, wherein that portion, as seen from a cross-sectional view along a line substantially perpendicular to a primary surface of a substrate, extends over and is spaced apart from another portion of the same structure. Such spaced-apart portions of the structure may be part of the same or different layers.

The term "precision deposition technique" is intended to mean a deposition technique that is capable of depositing one or more materials over a substrate at a dimension, as seen from a plan of the substrate, no greater than approximately one millimeter. A stencil mask, frame, well structure, patterned layer or other structure(s) may or may not be present during such deposition.

The term "primary surface" is intended to mean a surface of a substrate from which an electronic device is subsequently formed.

The term "radiation-emitting component" is intended to mean an electronic component, which when properly biased, emits radiation at a targeted wavelength or spectrum of wavelengths. The radiation may be within the visible-light spectrum or outside the visible-light spectrum (ultraviolet ("UV") or infrared ("IR")). A light-emitting diode is an example of a radiation-emitting component.

The term "radiation-responsive component" is intended to mean an electronic component can sense or otherwise respond to radiation at a targeted wavelength or spectrum of wavelengths. The radiation may be within the visible-light spectrum or outside the visible-light spectrum (UV or IR). Photodetectors, IR sensors, biosensors, and photovoltaic cells are examples of radiation-responsive components.

The term "receding edge" is intended to mean an edge of a layer or structure, wherein a thickness of the layer or structure gradually gets thinner near a distal point of the edge. A beveled edge, a concave edge, a convex edge, or the like is an example of a receding edge. A squared-off edge is not a receding edge.

The term "substrate" is intended to mean a base material that can be either rigid or flexible and may be include one or more layers of one or more materials, which can include, but are not limited to, glass, polymer, metal or ceramic materials or combinations thereof.

The term "user side" is intended to mean a side of the electronic device principally used during normal operation of the electronic device. In the case of a display, the side of the electronic device seen by a user would be a user side. In the case of a detector or voltaic cell, the user side would be the side that principally receives radiation that is to be detected or converted to electrical energy. Note that an electronic device may have more than one user side.

The term "well structure" is intended to structure that provides electrical insulation between adjacent electrodes, wherein at least part of the electrodes lie at a common elevation above the primary surface of the substrate.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Additionally, for clarity purposes and to give a general sense of the scope of the embodiments described herein, the use of the "a" or "an" are employed to describe one or more articles to which "a" or "an" refers. Therefore, the description should be read to include one or at least one whenever "a" or "an" is used, and the singular also includes the plural unless it is clear that the contrary is meant otherwise.

Group numbers corresponding to columns within the Periodic Table of the elements use the "New Notation" convention as seen in the *CRC Handbook of Chemistry and Physics,* 81$^{st}$ Edition (2000).

Unless otherwise defined, all technical and scientific terms used herein have the same meaning as commonly understood by one of ordinary skill in the art to which this invention belongs. Although suitable methods and materials are described herein for embodiments of the invention, or methods for making or using the same, other methods and materials similar or equivalent to those described can be used without departing from the scope of the invention. All publications, patent applications, patents, and other references mentioned herein are incorporated by reference in their entirety. In case of conflict, the present specification, including definitions, will control. In addition, the materials, methods, and examples are illustrative only and not intended to be limiting.

Other features and advantages of the invention will be apparent from the following detailed description, and from the claims.

To the extent not described herein, many details regarding specific materials, processing acts, and circuits are conventional and may be found in textbooks and other sources within the organic light-emitting diode display, photodetector, photovoltaic, and semiconductor arts.

2. Refraction, Reflection, and Waveguides

The waveguide effect is better understood with respect to FIG. 1. While the discussion of FIG. 1 is directed to light, other types of radiation may have similar effects. Note that the specificity in the materials and refractive indices given with respect to FIG. 1 are to simplify understanding of refraction and the waveguide effect and is not intended to limit the present invention. In FIG. 1, air 102 ($\eta$=1.0) lies adjacent to a first layer 104 (e.g., indium titanium oxide ("ITO"), $\eta$=2.0), a second layer 106 (e.g., organic active layer, $\eta$=1.6), and a cathode 108, which for the purposes of this discussion is considered a mirror. Interfaces 122, 124, and 126 lie between different pairs of the layers.

Radiation is emitted in a plurality of directions from a radiation emission site 142. At the interfaces 122, 124, and 126 between layers, radiation may pass from one layer into another, be reflected at the interface, or both. Because the cathode 108 is a mirror, essentially all light reaching interface 126 is reflected by the cathode 108. Whether any or all of the radiation is reflected at interfaces 122 and 124 depends on the refractive indices of the layers at the interface and the incident angle of the radiation, which is the approach angle for the radiation as measured from a line perpendicular to the interface. Referring to FIG. 1, an incident angle of 0° corresponds to radiation propagating in a direction along a vertical axis. If the incident angle is larger than a critical angle, at least some of the radiation is reflected at the interface. If the incident angle is the same or less than the critical angle, substantially all of the radiation passes through the interface. The critical angle ($\theta_c$) is given by Equation 1.

$$\theta_c = \sin^{-1}(\eta_2/\eta_1) \quad \text{Equation 1}$$

wherein:

$\eta_1$ is the refractive index of a first layer or material in which the radiation is propagating; and $\eta_2$ is the refractive index of a second layer or material lying on the other side of the interface of the first layer or material.

Radiation 162, 164, and 166 are emitted from emission site 142. Radiation 162 propagates in a direction substantially perpendicular to interfaces 124 and 122. Therefore, substantially all of the radiation passes into the air 102 without any refraction. Radiation 164 is initially reflected by the cathode 108 at interface 126. Radiation 164 propagates through the second layer 106 and reaches interface 124 at an angle less than the critical angle but higher than 0°. Radiation 164 is refracted as it propagates through the interface 124. Radiation 164 propagates through the first layer 104 and reaches interface 122 at an angle less than the critical angle but higher than 0°. Radiation 164 is refracted as it propagates through the interface 122.

Radiation 166 illustrates the waveguide effect. Radiation 166 reaches interface 124, the incident angle is greater than the critical angle. Therefore, some of the radiation is reflected by the interface 124, as illustrated by radiation 169. However, because the refractive index of the second layer 106 ($\eta$=1.6) is lower than the refractive index of the first layer 104 ($\eta$=2.0), some of the radiation 166 enters the first layer 104, as illustrated by radiation 168. Radiation 169 continues to propagate within the second layer 106 in a manner similar to radiation 166.

Radiation 168 propagates through the first layer 104 until it reaches interface 122. Because the incident angle of radiation 168 at interface 122 is greater than the critical angle, radiation 168 is reflected by interface 122. Because the refractive index of the first layer 104 ($\eta$=2.0) is greater than air 102 ($\eta$=1.0), substantially all of the radiation 168 is reflected at the interface 122. Radiation 168 continues to propagate through the first layer 104 until it reaches the interface 124 with the second layer 106. Similar to radiation 168 at interface 122, because the incident angle of radiation 168 at interface 124 is greater than the critical angle, radiation 168 is reflected by interface 124. Because the refractive index of the first layer 104 ($\eta$=2.0) is greater than the second layer 106 ($\eta$=1.6), substantially all of the radiation 168 is reflected at the interface 124.

As can be seen, radiation 166 is propagating laterally within layers 104 and 106 via radiation 168 and 169. The radiation from radiation 166 is effectively trapped and propagates laterally, which is usually undesired.

3. Halo Effect

The inventors have discovered a way to harness at least some of the radiation propagating laterally and redirect it in a direction more towards the user of the device. By interfering with the waveguide effect, the inventors have taken what is generally considered an unproductive and undesired effect to produce a beneficial phenomenon that typically manifests itself as a halo surrounding a radiation-emitting component (e.g., an OLED). The intensity of the radiation emitting within the halo may be higher than the intensity of radiation emitting within the center of a radiation-emitting component.

Although the mechanism and physical effects are not fully understood, the halo effect may occur when a first layer having an edge is covered by a second layer, wherein the second layer overlies the edge and the refractive index of the second layer is lower than the refractive index of the first layer.

By producing the halo effect, more radiation may be received by a user of the electronic device without an increase in driving voltage for the radiation-emitting component. More emission area is possible without increasing the size of the radiation-emitting component.

While much of the discussion herein is directed towards radiation-emitting components, similar effects may occur for radiation-responsive components. The use of the designs described herein may be used to increase the effective reception area of a radiation-responsive component without increasing the actual size of the radiation-responsive component.

4. Fabrication Process

Attention is now directed to details for a first set of embodiments that is described and illustrated in FIGS. 2 to 12 in which a halo effect can be seen with pixels. Materials currently used in forming the organic electronic devices can be used. Therefore, process development and integration concerns with new materials may be avoided.

The embodiment as illustrated in FIGS. 2 to 12 may be used for making a monochromatic passive matrix OLED display. Modifications that may be made for use with multi-color or full-color passive matrix and active matrix OLED displays are described later in this specification.

Figure 2:
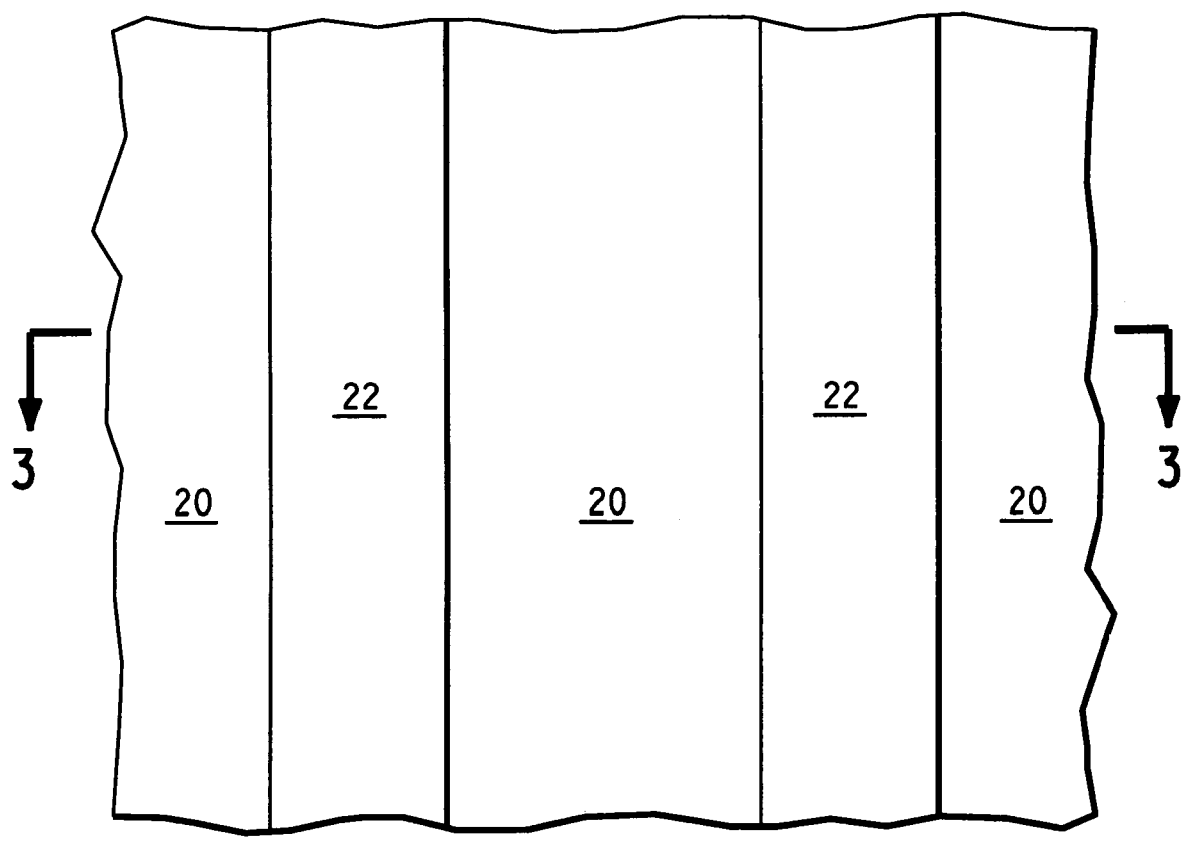
FIGS. 2 and 3 include illustrations of a plan view and a cross-sectional view, respectively, of a portion of an array within an electronic device after forming first electrodes.

FIG. 2 includes a plan view of a portion of a substrate 20. More specifically, FIG. 2 includes a portion of an array for a display. Peripheral and remote circuitry are not illustrated to simplify the understanding of the invention. Such peripheral and remote circuitry may be formed before formation of the array, during formation of the array, after formation of the array, or any combination thereof. The substrate 20 can include nearly any type and number of materials including organic, inorganic, conductive, semiconductive, or insulating materials. The materials and thicknesses of materials are conventional. If the substrate 20 lies along a user side of the electronic device, the substrate 20 should be capable of transmitting at least 70% of the radiation propagating normal to the surface of the substrate 20 along the user side. Depending on the material(s) selected for the substrate 20, each of the materials may have a refractive index in a range of approximately 1.4 to 1.8. Glass and many types of plastics used in substrates have refractive indices in a range of approximately 1.5 to 1.6.

After reading this specification, skilled artisans appreciate that the selection of material(s) that can be used for the substrate 20 varies widely. After reading this specification, skilled artisans are capable of selecting the appropriate material(s) based on their physical, chemical, and electrical properties. For simplicity, the material(s) used for this base are referred to as substrate 20.

Figure 3:
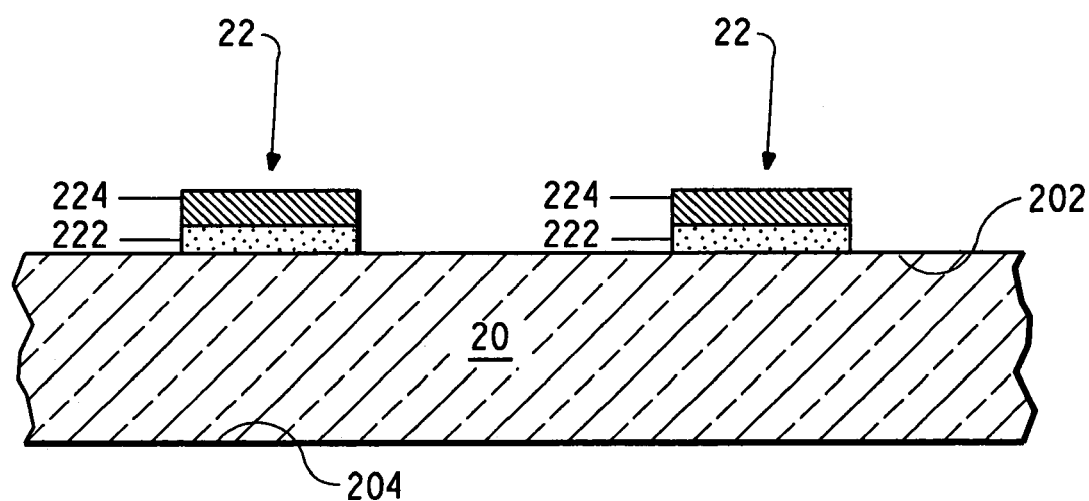

First electrodes 22 may then be formed over a primary surface 202 of the substrate 20 as illustrated in FIGS. 2 and 3. The first electrodes 22, which are a specific type of electrically active structure, can include nearly any conductive material. In this specific embodiment, the first electrodes 22 act as anodes for the electronic device being formed. In general, the material of the first electrodes 22 has a work function relatively higher than subsequently formed second electrodes that act as the cathodes. A plurality of layers may be formed to create the first electrodes 22. One or more of the layers within the first electrodes 22 can have a refractive index in a range of approximately 1.8 to 3.0. In one particular embodiment, the first electrodes 22 include layers of silicon nitride 222 and ITO 224. Silicon nitride 222 can have a refractive index in a range of approximately 1.9 to 2.4 depending on the deposition conditions. The ITO 224 may have a refractive index of approximately 2.0. In one specific embodiment, the silicon nitride 222 and ITO 224 may have refractive indices that are substantially the same, such as approximately 2.0.

In the embodiment illustrated in FIGS. 2 and 3, the first electrodes 22 lie between a user side 204 of the electronic device and the subsequently formed organic active layer. Therefore, first electrodes 22 should be transparent to allow the radiation to be transmitted through the first electrodes 22. Additionally, at least one of the layers within the first electrodes 22 has a refractive index higher than the material within the substrate 20 along the primary surface 202 of the substrate 20. Exemplary materials include ITO, zirconium tin oxide ("ZTO"), elemental metals, metal alloys, and combinations thereof. ITO and ZTO may be thicker when used as the first electrodes 22 and still allow sufficient transmission of radiation. For example, when ITO or ZTO are used as the first electrode 22, the first electrodes 22 may have a thickness in a range of approximately 100 to 200 nm. More specifically, the thickness of the silicon nitride layer 222 can be in a range of approximately 50 to 1000 nm, and thickness of the ITO layer 224 can be in a range of approximately 50 to 150 nm. The first electrodes 22 are formed using a conventional technique.

Figure 4:
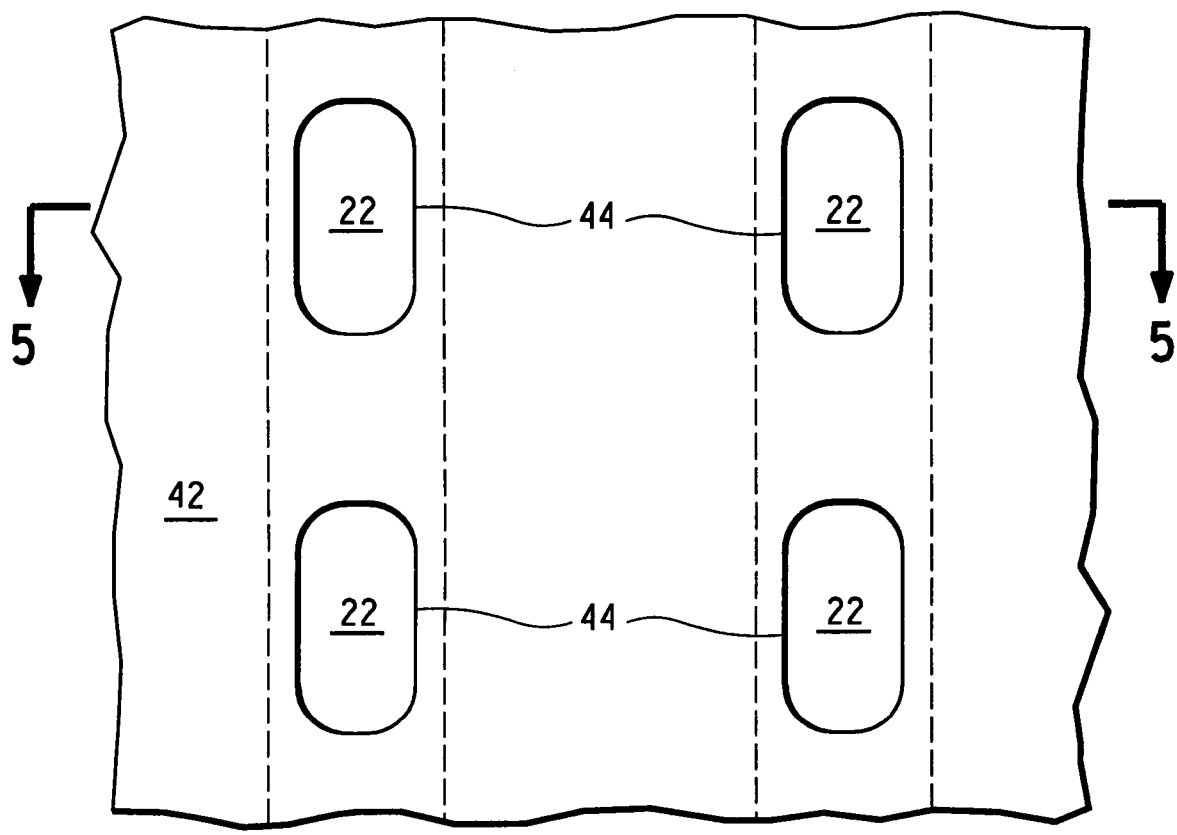
FIGS. 4 and 5 include illustrations of a plan view and a cross-sectional view, respectively, of the array of FIGS. 2 and 3 after forming well structures.
Figure 5:
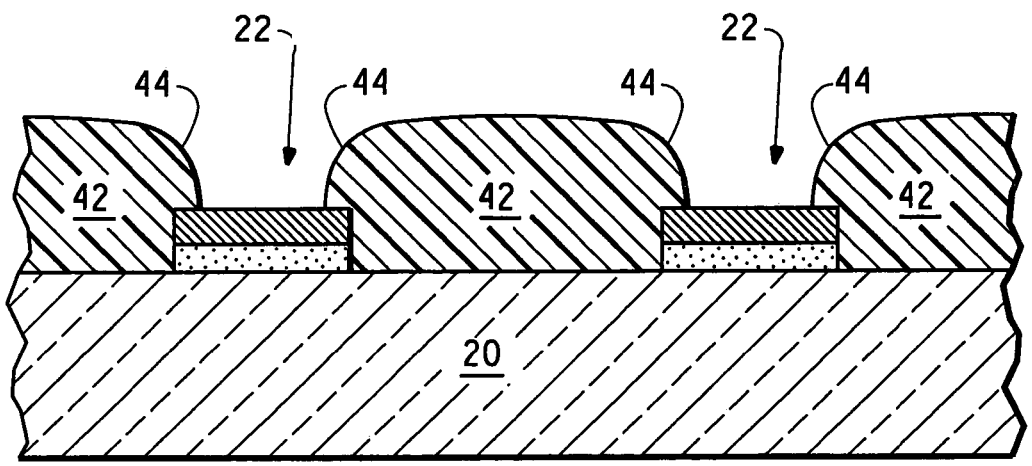

One or more well structures 42 may be formed as illustrated in FIGS. 4 and 5. The well structures 42 include edges 44 that define where the radiation-emitting components will be formed. In one embodiment, the well structures 42 are not electrically active structures. The well structures 42 include one or more layers of material(s) that are relatively inert to subsequent processing, not opaque to the radiation, and are electrically insulating. Some non-limiting exemplary materials include radiation imaginable materials (e.g., photoresists, including positive acting (Novolac) and negative acting, polyimide, etc.), silicon nitride, silicon oxide (including silicon dioxide, siloxanes, spin-on glass, etc.), undoped or lightly doped silicon, metal oxides, metal nitrides, metal oxynitrides, and combinations thereof. In one embodiment, the material(s) may be transparent to radiation emitted by the radiation-emitting component, and in another embodiment, the material(s) may be translucent to radiation emitted by the radiation-emitting component. In still another embodiment, the well structures 42 define areas where portions of an organic layer will be formed. The well structures 42 may help to keep different materials of organic layers away from one another. In one embodiment, the well structures can help to keep red and green light-emitting materials from entering the area for a blue light-emitting component. The well structures may also help to electrically insulate the first electrodes 22 from one another. Each layer within the well structures 42 can include an organic material, an inorganic material, or a combination thereof. One or more of the layers within the well structures 22 can have a refractive index in a range of approximately 1.8 to 3.0. In one embodiment, one or more layers within the first electrodes 22 have a refractive index that is in a range of approximately 90 to 110% of a refractive index of one or more layers within the well structure 42. In one specific embodiment, the well structures 42 may be made from a layer of polyimide, and the first electrodes 42 may include silicon nitride 222 and ITO 224. For this specific embodiment, all layers within the well structures 42 and first electrodes 22 may have substantially the same refractive index, namely 2.0.

The well structures 42 may be formed by depositing layer(s) of material(s) and then patterning those layer(s) or by forming the pattern as the layer(s) for the well structures 42 is deposited. For the purposes of this specification, deposition is to be construed broadly to include liquid or vapor deposition techniques used in the microelectronics art (OLED, flat panel, semiconductor and other similar arts). After the well structures 42 are formed, they have an edge 44, which in this embodiment is a concave edge that forms a dome-shaped structure.

Figure 6:
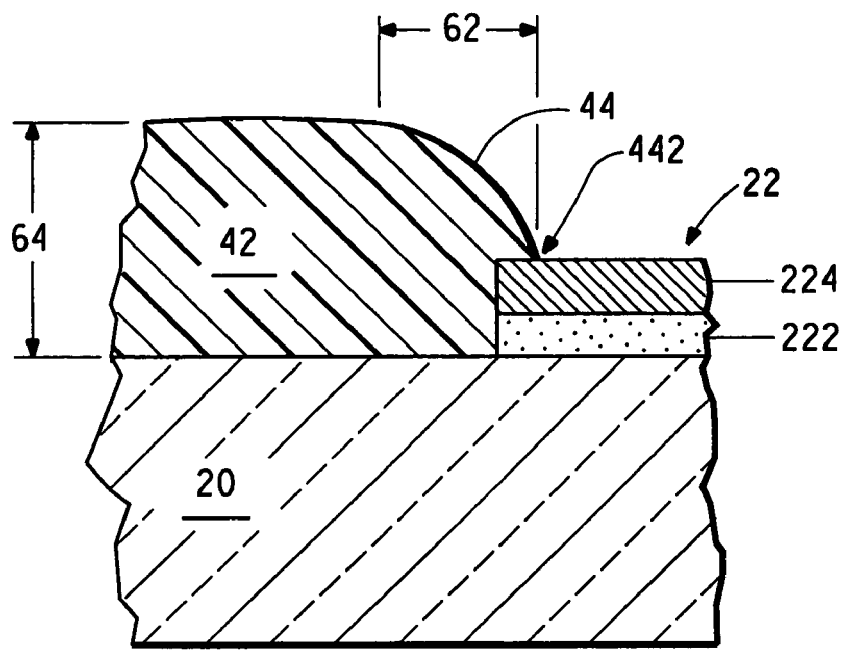
FIG. 6 includes an illustration of a cross-sectional view of an enlarged portion of FIG. 5 near an edge of a well structure.

FIG. 6 includes an enlarged view of a portion of FIG. 5 to show better the relationships of the different parts of the electronic device at this point in the process. In one embodiment, the height (thickness) 64 of the well structure 42 is at least as thick as a combined thickness of the first electrodes 22 and the subsequently formed organic layer. In another embodiment, the height 64 is in a range of approximately 0.5 to 10.0 microns. In another embodiment, the height may be in a range of approximately 1.0 to 3.0 microns. As previously pointed out, the well structure has a concave edge 44. The distance 62 from an end 442 of the well structure 42 to a closest point where the well structure 42 has a substantially flat upper surface may be in a range of approximately 1 to 10 microns. In one specific embodiment, the height 64 is approximately 2.0 microns, and the distance 62 is approximately 5.0 microns.

Figure 7:
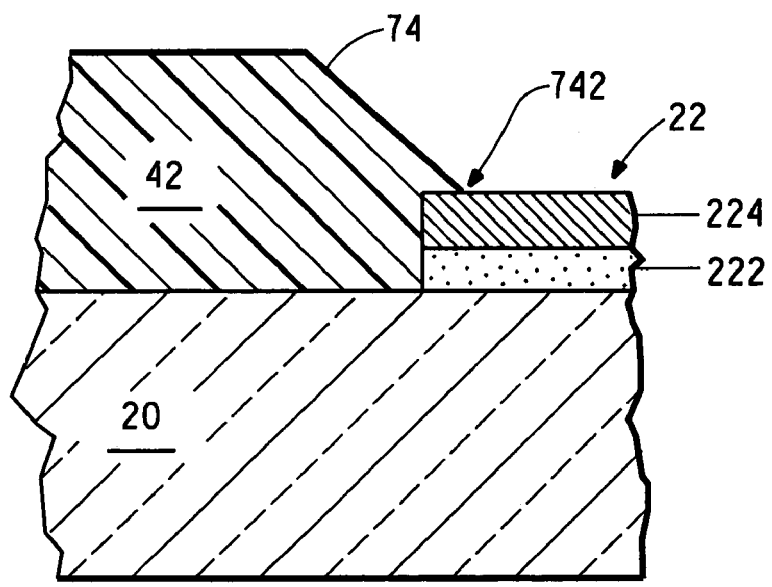
FIGS. 7-9 include illustrations of cross-sectional views of alternative embodiments for the shape of the edge of the well structure.
Figure 8:
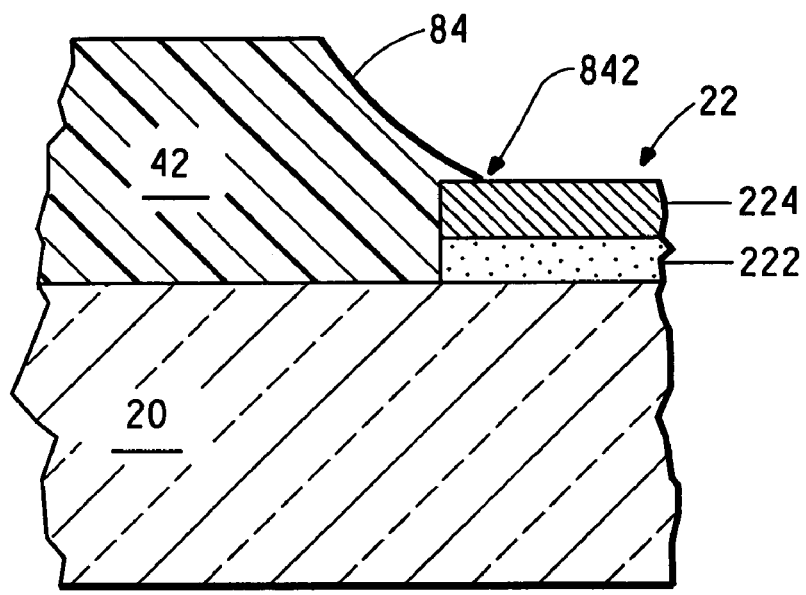
Figure 9:
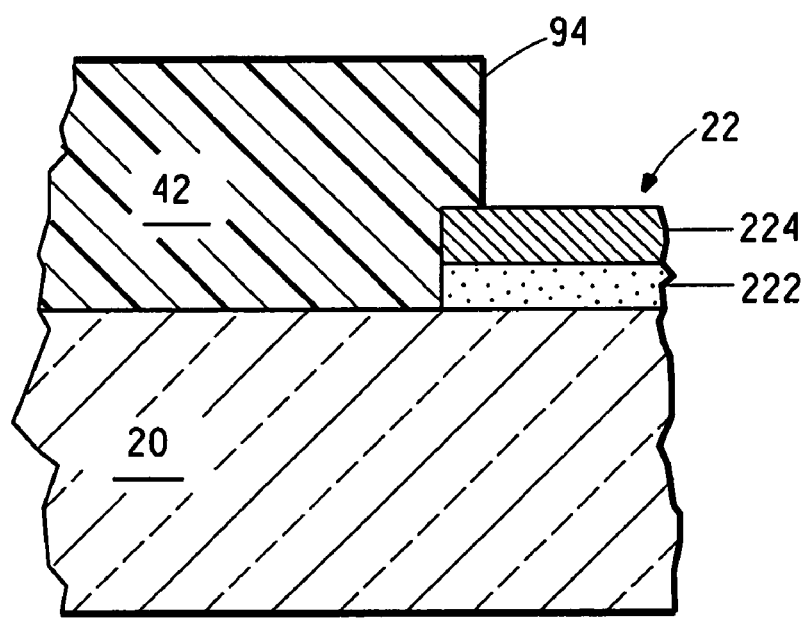

FIGS. 7 to 9 illustrate other potential shapes for edges of the well structures 42. FIG. 7 includes a beveled edge 74, FIG. 8 includes a convex edge 84, and FIG. 9 includes a step-function edge 94. Edges 44, 74, and 84 are examples of receding edges, in that the thickness of the well structure 42 becomes gradually thinner near the ends 442, 742, or 842 over the first electrodes 22. Step-function edge 94 does not have a receding edge. Note that each of the edges 44, 74, 84, and 94 can help to break up the waveguide effect within a subsequently formed organic layer and allow more radiation to be emitted along the user side 204 of the electronic device. A receding edge may be more efficient at emitting radiation as compared to the step-function edge 94. In one embodiment, the edge of the first electrodes 22 underlies the receding edge (edge 44, 74, 84).

A few, non-limiting methods are described regarding how to achieve the edges 44, 74, 84, and 94. After reading this specification, skilled artisans will appreciate that many other methods are possible.

In one embodiment, edges 44 may be obtained by depositing one or more layers of material(s) and patterning the layer(s) using a conventional technique. The patterned layer may be subjected to an elevated temperature (i.e., higher than room temperature) such that corners of the pattern are rounded to obtain the edges 44. The corner rounding may be referred to as a reflow process. In one specific embodiment, photoresist is the material, and the temperature for the reflow is in a range of approximately 100 to 250° C. for a time period in a range of approximately 1 to 10 minutes. In another specific embodiment, borosilicate glass is the material, and the temperature for the reflow is in a range of approximately 400 to 700° C. for a time period in a range of approximately 10 to 30 minutes. The reflow process is not significantly affected by pressure, and therefore, the reflow may be performed at approximately atmospheric pressure. The rounding to form the edges 44 is a function of the material, time and temperature. For any particular material, as the time, temperature, or both are too low, the degree of rounding may be insufficient. If the time, temperature, or both are too high, too much of the well structure 42 may flow over the first electrodes 22 and reduce pixel size, or in a worse case, not allow a pixel to be properly formed (e.g., form an electrical open between the electrodes of the pixel).

In another embodiment, the edges 44 may be obtained by depositing a layer using a precision deposition technique, such as printing (e.g., ink-jet printing or screen printing). After depositing, a solvent within the material may be evaporated. The edges 44 may be formed as deposited or may be obtained during the solvent evaporation activity. If the edges 44 need further rounding, then a reflow process, such as the one previously described may be used. In still another embodiment, a stencil mask may be used so that the layer is only deposited where the well structures are to be formed. A reflow process may be used if further corner rounding is needed.

Referring to FIG. 7, the beveled edges 74 may be obtained using a resist erosion process. Resist erosion processes are conventional within the semiconductor arts to form contact openings. After depositing the layer for the well structures 42 over all the array, a patterning resist layer (not shown) is formed over the layer for the well structures 42. In one embodiment, the edge of the resist layer corresponds to the end 742. An etching technique is performed to removing portions of the layer for the well structures 42 from over the first electrodes 22. While the layer for the well structures 42 is being etched, the resist is being etched in a lateral direction to increase the size of the opening in the resist layer. In one embodiment, the resist layer includes an organic material, and oxygen can be used in the etching gas to etch the resist layer. If the layer for the well structures 42 includes silicon nitride, the etching gas may include fluorine-containing species (e.g., fluorinated methane or ethane ($CF_4$, $CHF_3$, $C_2F_6$, $C_2F_4H_2$, etc.), $SF_6$, $NF_3$, $F_2$, and combinations thereof) and an oxygen-containing species (e.g., $O_2$, $O_3$, or the like). The slope of the beveled edges 74 may be adjusted by changing the ratio of fluorine atoms to oxygen atoms within the etching gas. As the ratio of fluorine atoms to oxygen atoms in the etching gas increases, the beveled edge 74 will be steeper (closer to a vertical edge), and as the ratio of fluorine atoms to oxygen atoms in the etching gas decreases, the beveled edge 74 will have a shallower angle (when using the primary surface 204 as a reference plane). Any remaining portion of the resist layer can be removed using a conventional technique.

Referring to FIG. 8, the convex edges 84 can be obtained using an isotropic etching technique. A resist layer (not shown) is formed and patterned similar to an embodiment described with respect to the beveled edges 74. In one embodiment, the edge of the resist layer corresponds to the end 842. However, unlike an embodiment described with respect to FIG. 7, in this embodiment, the resist layer may not be significantly etched. The etch may be performed using wet chemical etching or dry etching technique. In one embodiment, the etchant used for the isotropic etching etches the layer of the well structures 42 selectively to the resist layer and the material of the uppermost layer of the first electrodes 22. After etching, the resist layer can be removed using a conventional technique.

Referring to FIG. 9, the step-function edges 94 can be obtained using an anisotropic etching technique. A resist layer (not shown) is formed and patterned similar to an embodiment described with respect to the beveled edges 74. Similar to the embodiment described with respect to FIG. 8, in this embodiment, the resist layer may not be significantly etched. The etch may be performed using a dry etching technique. In one embodiment, the etchant used for the anisotropic etching etches the layer of the well structures 42 selectively to the resist layer and the material of the uppermost layer of the first electrodes 22. The anisotropic etching helps to transfer the edge of the resist layer into the layer for the well structures 42. After etching, the resist layer can be removed using a conventional technique.

In another embodiment, the edges 94 may be obtained by depositing a layer using a precision deposition technique, such as printing (e.g., ink-jet printing or screen printing). After depositing, a solvent within the material may be evaporated. In still another embodiment, a stencil mask may be used so that the layer is only deposited where the well structures 42 are to be formed. In one embodiment, the stencil mask may be used with a vapor deposition technique. Unlike an embodiment of FIG. 7, a reflow process may be not be required.

Figure 10:
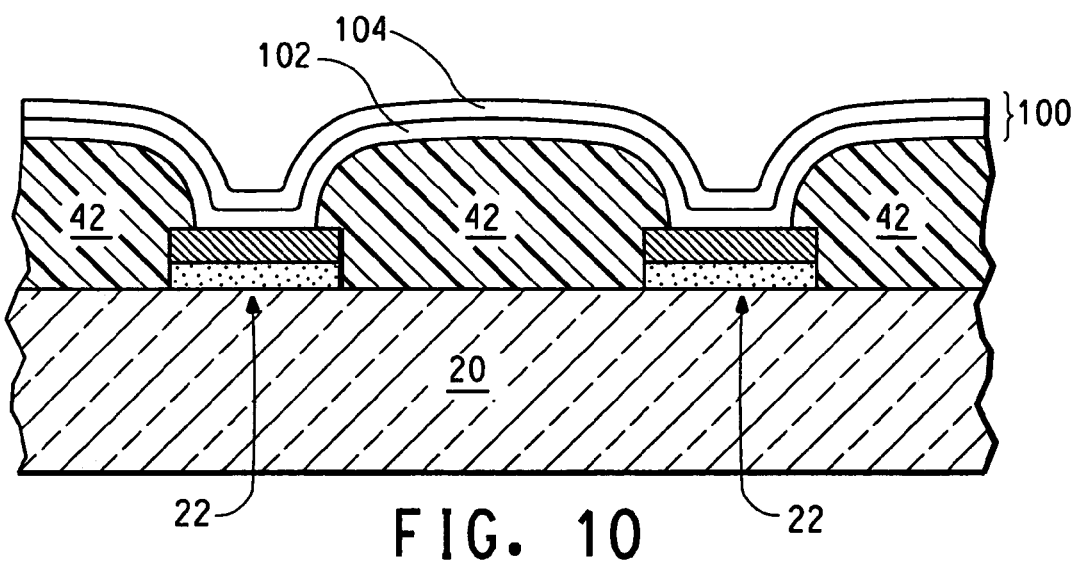
FIG. 10 includes an illustration of a cross-sectional view of the array in FIG. 5 after forming an organic layer including a hole-transport layer and an organic active layer.

After the well structures 42 have been formed, an organic layer 100 is formed as illustrated in FIG. 10. The organic layer 100 may include one or more layers. For example, the organic layer 100 may include a hole-transport layer 102 and an organic active layer 104, or the organic active layer 104 without the hole transport layer 102. Although not shown, the organic layer 100 may include an electron-transport layer. It is further understood that organic layer 100 in organic electronic devices may include a variety of organic materials, such as charge transport materials, anti-quenching materials, a variety of active materials (e.g. light-emitters, photodetectors, IR detectors and other radiation sensitive materials).

The hole-transport layer 102 and the organic active layer 104 are formed sequentially over the first electrodes 22 and at least portions of the well structures 42. Each of the hole-transport layer 102 and the organic active layer 104 can be formed by using a liquid deposition technique to deposit appropriate materials as described below. One or both of the hole-transport layer 102 and the organic active layer 104 may be cured after it is applied. In one embodiment, the organic layer 100 overlies all of first electrodes 22 and the well structures 42. In an alternative embodiment, the organic layer 100 lies within the openings of the well structures 42 and along only a portion of the well structures 42 near the edges 44, 74, 84, or 94. In this embodiment, a precision deposition technique, such as ink-jet printing, may be used to dispense a small amount of the organic layer, such that the organic layer 100 is discontinuous between the radiation-emitting components. In another embodiment, the hole-transport layer 102 may be formed over all of the well structures 42 within the array, but the organic active layer 104 may only be formed within the openings of the well structures 42 and may or may not overlap onto edges 44, 74, 84, or 94 of the well structures 42.

In one embodiment, the hole-transport layer 102 can include an organic polymer, such as polyaniline ("PANI"), poly(3,4-ethylenedioxythiophene) ("PEDOT"), or an organic charge transfer compound, such as tetrathiafulvalene tetracyanoquinodimethane (TTF-TCQN). The hole-transport layer 104 typically has a thickness in a range of approximately 100 to 250 nm.

The composition of the organic active layer 104 typically depends upon the application of the electronic device. When the organic active layer 104 is used in a radiation-emitting electronic device, the material(s) of the organic active layer 104 will emit radiation when sufficient bias voltage is applied to the anode and cathode. The radiation-emitting active layer may contain nearly any organic electroluminescent or other organic radiation-emitting materials.

Such materials can be small molecule materials or polymeric materials. Small molecule materials may include those described in, for example, U.S. Pat. No. 4,356,429 and U.S. Pat. No. 4,539,507. Alternatively, polymeric materials may include those described in U.S. Pat. No. 5,247,190, U.S. Pat. No. 5,408,109, and U.S. Pat. No. 5,317,169. Exemplary materials are semiconducting conjugated polymers. An example of such a polymer is poly(phenylenevinylene) referred to as "PPV." The light-emitting materials may be dispersed in a matrix of another material, with or without additives, but typically form a layer alone. The organic active layer generally has a thickness in the range of approximately 40 to 100 nm.

When the organic active layer 104 is incorporated into a radiation-responsive electronic device, the material(s) of the organic active layer 104 may include many conjugated polymers and electroluminescent materials. Such materials include for example, many conjugated polymers and electro- and photo-luminescent materials. Specific examples include poly(2-methoxy,5-(2-ethyl-hexyloxy)-1,4-phenylene vinylene) ("MEH-PPV") and MEH-PPV composites with CN-PPV. The organic active layer 104 typically has a thickness in a range of approximately 50 to 500 nm.

Although not shown, an optional electron-transport layer may be formed over the organic active layer 104. In one specific embodiment, the electron-transport layer can include metal-chelated oxinoid compounds (e.g., Alq$_3$); phenanthroline-based compounds (e.g., 2,9-dimethyl-4,7-diphenyl-1,10-phenanthroline ("DDPA"), 4,7-diphenyl-1,10-phenanthroline ("DPA")); azole compounds (e.g., 2-(4-biphenyl)-5-(4-t-butylphenyl)-1,3,4-oxadiazole ("PBD"), 3-(4-biphenyl)$_4$-phenyl-5-(4-t-butylphenyl)-1,2,4-triazole ("TAZ"); or any one or more combinations thereof. Alternatively, the optional electron-transport layer may be inorganic and include BaO, LiF, or Li$_2$O. The electron-transport layer typically has a thickness in a range of approximately 30 to 500 nm.

In one embodiment, each of the layers within the organic layer 100 may have a refractive index in a range 1.4 to 1.8. In one particular embodiment, each of the hole-transport layer 102 and organic active layer 104 have a refractive index of approximately 1.6.

Figure 11:
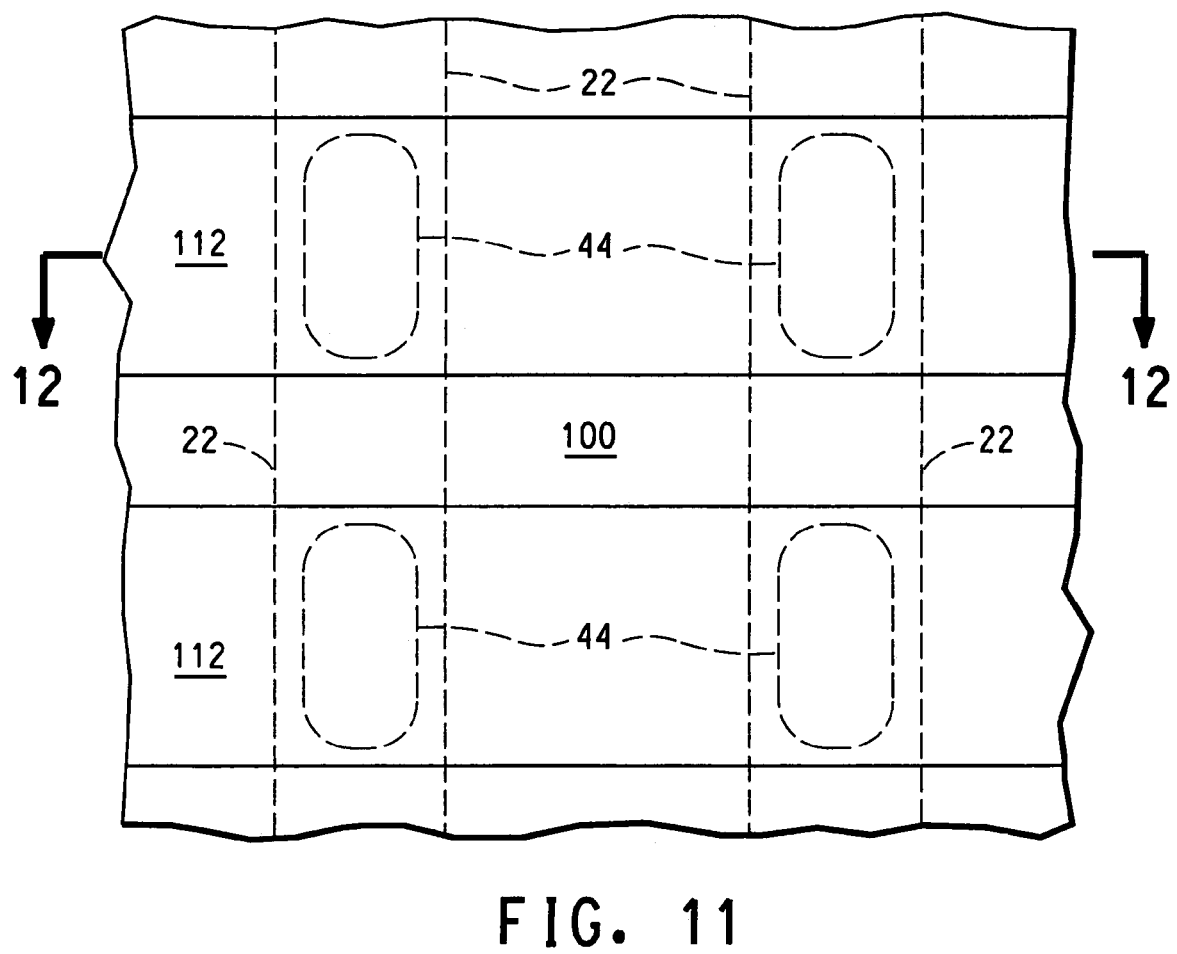
FIGS. 11 and 12 include illustrations of a plan view and a cross-sectional view, respectively, of the array of FIG. 10 after forming second electrodes.
Figure 12:
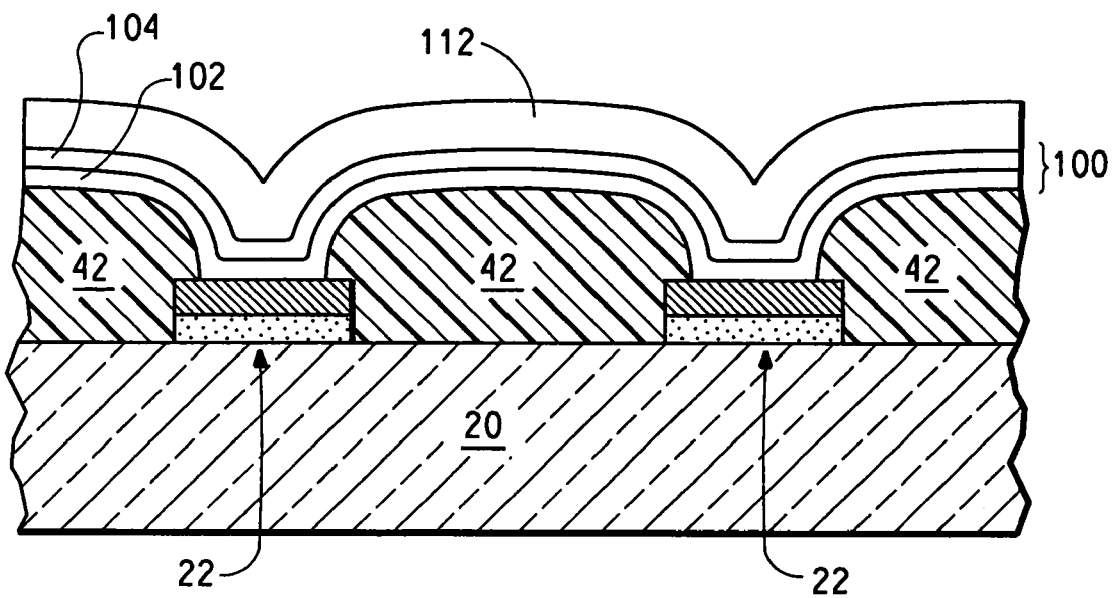

Second electrodes 112 are formed over openings within the well structures 42 and portions of the first electrodes 22, well structures 42, and organic layer 100 as illustrated in FIGS. 11 and 12. The second electrodes 112 act as cathodes for the electronic device. In one embodiment, the second electrodes 112 can include a metal-containing layer having a low work function, which is lower than the first electrodes 22 that have a high work function. Materials for the second electrodes 112 can be selected from Group 1 metals (e.g., Li, Cs), the Group 2 (alkaline earth) metals, the rare earth metals including the lanthanides and the actinides. The second electrodes 112 have a thickness in a range of approximately 300 to 600 nm. In one specific, non-limiting embodiment, a Ba layer of less than approximately 10 nm followed by an Al layer of approximately 500 nm may be deposited. A stencil mask corresponding to the pattern of the second electrodes 112 can be used with a conventional deposition process, such as evaporation, sputtering, or the like. For simplicity, the second electrodes 112 are considered an optical mirror.

Other circuitry not illustrated in FIGS. 2 to 12 may be formed using any number of the previously described or additional layers. Although not shown, additional insulating layer(s) and interconnect level(s) may be formed to allow for circuitry in peripheral areas (not shown) that may lie outside the array. Such circuitry may include row or column decoders, strobes (e.g., row array strobe, column array strobe), or sense amplifiers.

An encapsulating layer (not shown) can be formed over the array and the peripheral and remote circuitry to form a substantially completed electrical component, such as an electronic display, a radiation detector, and a voltaic cell. The encapsulating layer may be attached to the substrate 20. Radiation may be transmitted through the encapsulating layer. If so, the encapsulating layer should be transparent to the radiation.

In one embodiment, the electronic device comprises one or more radiation-emitting components, one or more radiation-responsive components, or any combination thereof. Within each of the radiation-emitting component(s) or radiation-responsive components, electrically active structures can include the first electrodes 22, the second electrodes 112, and portions of the organic layer 100 lying between the first electrodes 22 and second electrodes 112. Charge carriers can flow through the first electrodes 22, second electrodes 112, or both. With respect to the organic layer 100, for a radiation-emitting component, charge carriers can flow into the organic layer 100 from the first electrodes 22, second electrodes 112, or both, and radiation can be emitted from the organic layer 100. For a radiation-responsive component, radiation can be received by the organic layer 100, thus producing charge carriers that can flow from the organic layer 100 to the first electrodes 22, second electrodes 112, or both. For the purposes of this specification, a thin-film transistor is not considered an electrically active structure because it is not part of a radiation-emitting component (e.g., an OLED) or a radiation-responsive component (e.g., radiation sensor or photovoltaic cell).

5. Device Operation and the Halo Effect

Figure 13:
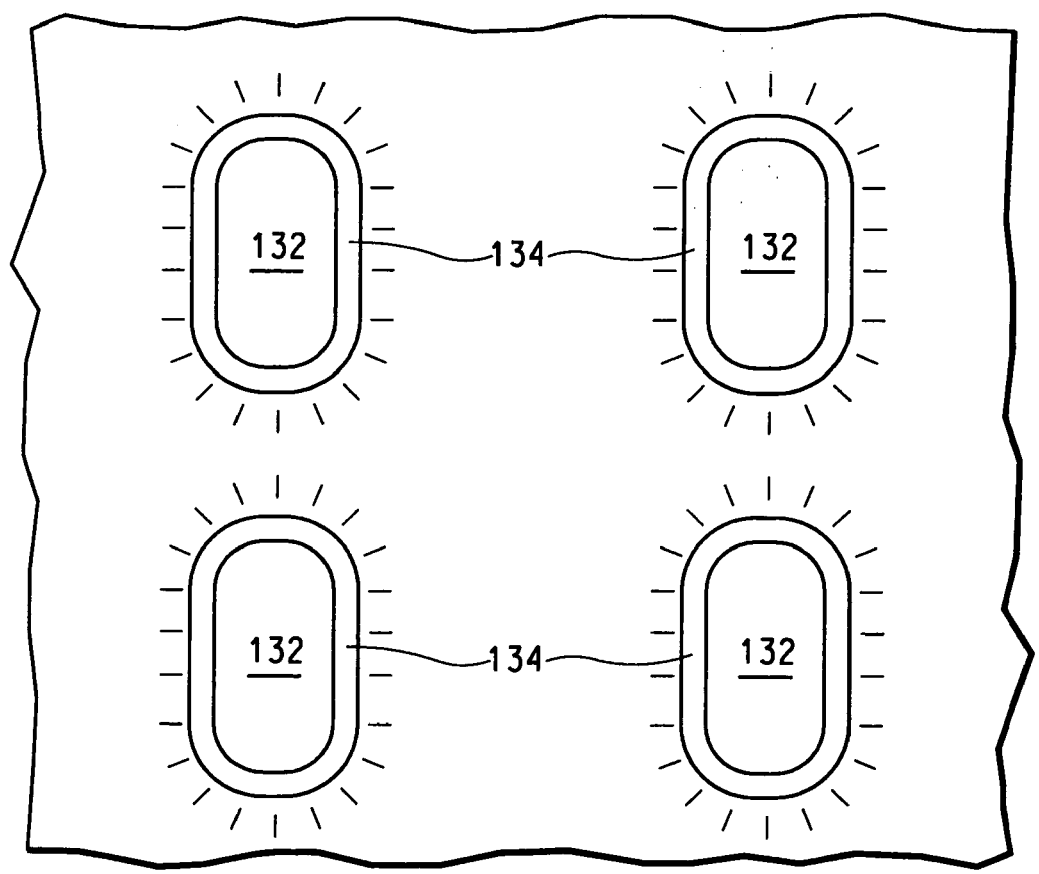
FIG. 13 includes an illustration of a plan view of the array in FIGS. 11 and 12 during operation, wherein halos appear near edges of the radiation-emitting components.

In one embodiment, a display is formed having an array of radiation-emitting components. When the first and second electrodes 22 and 112 are properly biased, the radiation-emitting components can emit radiation as illustrated in FIG. 13, which is a view from a user side of the electronic device. The actual size of the radiation-emitting component 132 is defined by the openings within the well structures 42 and generally corresponds to the inner solid ovals as seen in FIG. 13. Additional radiation can be emitted that appears to be halos 134 that surround the radiation-emitting components 132. As seen in FIG. 13, the emission intensity of the halos 134 is higher than the emission intensity near the center of the radiation-emitting components 132. In one embodiment, the emission intensity of the halos 134 is in a range of approximately 10 to 100% higher than the emission intensity near the center of the radiation-emitting components 132. The halos 134 increase the amount of radiation seen by a user without an increase in power.

Figure 14:
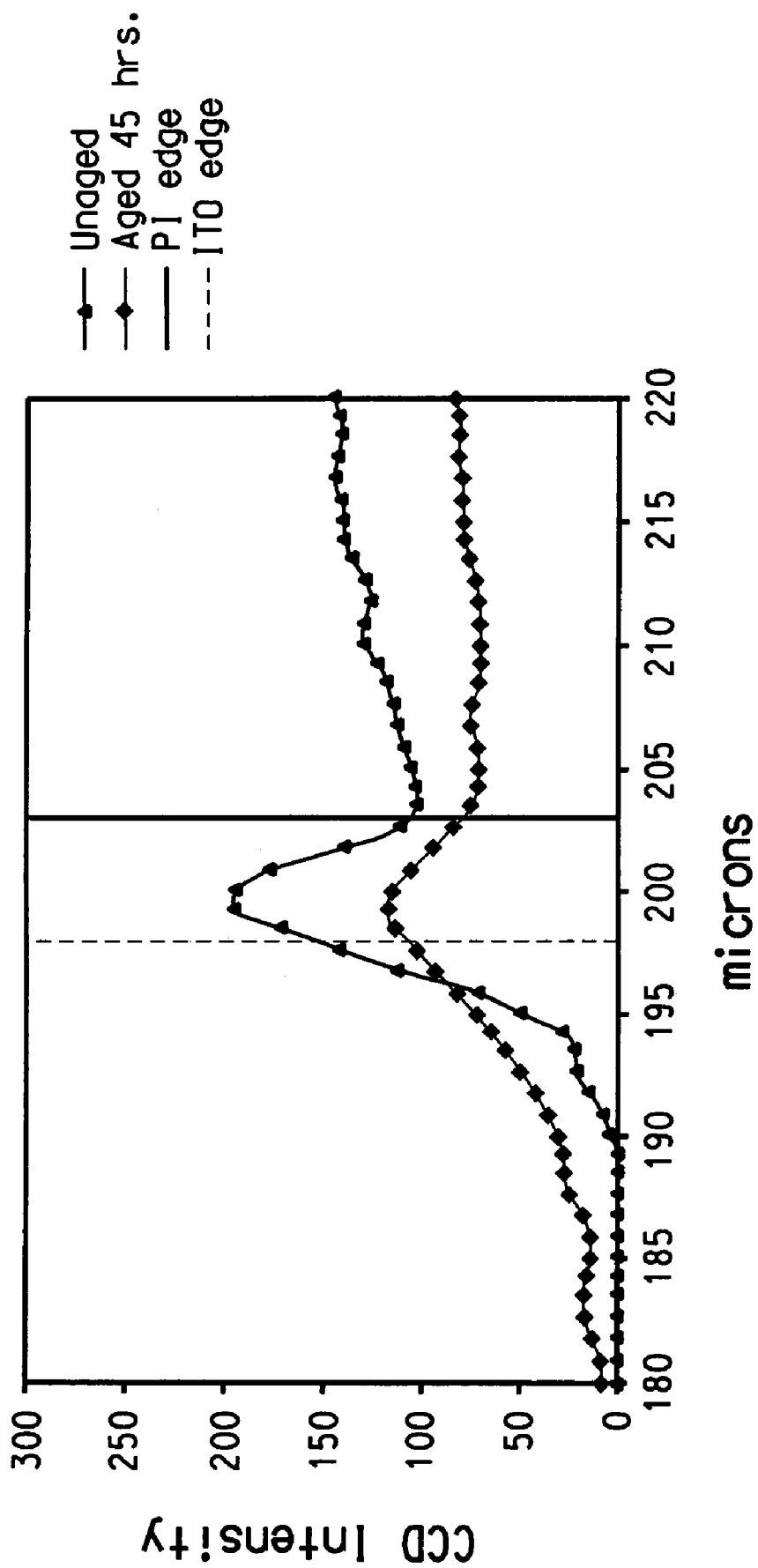
FIG. 14 includes a plot of intensity as a function of distance, wherein emission intensity within the halo is larger than emission intensity near the center of the radiation-emission component.

FIG. 14 includes a plot of radiation emission intensity as a function of distance. The edge of the well structure 42 ("PI edge") is at approximately 203 microns, and the edge of the first electrode 22 ("ITO edge") is at approximately 198 microns. In other words, the well structure 42 overlaps the first electrode 22 by approximately five microns. Referring to the "unaged" device, near the center of the radiation-emitting component (towards the right-hand side of FIG. 14), the intensity is approximately 140.

Closer to the edge of the well structure 42, the emission intensity is reduced to approximately 105. The emission intensity peaks within the halos 134 at approximately 190, and the tails off. In FIG. 14, the peak emission intensity in the halo 134 is approximately 50% higher than near the center of the radiation-emitting component. At approximately 192 microns, the emission intensity is only about 10% of the peak emission intensity. Referring to the "aged 45 hrs" device, a similar effect is seen. The halo 134 has a peak with a higher intensity compared to the center of the radiation-emitting component. Still, the peak emission intensity in the halo 134 is approximately 50% higher than near the center of the radiation-emitting component. However, the peak is less intense (approximately 120) and the tail toward the left is less steep. To a user of the electronic device, the image would appear more blurred or "bleeding" with the electronic device "aged 45 hrs." At 182 microns, the intensity is only about 10% of the peak intensity.

The width of the halo 134 may be a function of the shape at the edge of the well structure or any of its layer(s), the thickness(es) of the organic layer 100, and age of the device. In one embodiment, the width of the halo may be in a range of approximately 1 to 50 microns, and in another embodiment, the width of the halo may be in a range of approximately 5 to 20 microns.

Although not fully understood and characterized, the halo 134 may be related to the shapes (including thicknesses) and refractive indices of the layers and structures near the edges of the radiation-emitting components. In one embodiment, the organic layer 100 overlaps onto at least a portion of the layer within the well structures 42. The difference in elevation seen by the organic layer 100 may disrupt at least part of the waveguide effect within the organic layer 100. Radiation may propagate along the planar portions of the organic layer 100 and reach the well structures 42. Because the radiation may be incident with layer(s) within the well structures 42 at an angle less than the critical angle for those layer(s), radiation that would otherwise continue to propagate along the organic layer 100 may pass into the well structure 42. Also, to the extent other radiation would continue to propagate, the change in topography may change the angles at which the radiation propagates, so that the radiation may "bounce around" the region where the organic layer 100 overlies edges of layer(s) within the well structures 42. Reflections from the interfaces, including the interface between the organic layer 100 and the second electrodes 112, may eventually allow some of the radiation to exit the user side of the electronic device.

The halo 134 may be related to layer(s) within the well structures 42 overlapping over edges of layer(s) within the first electrodes 22. The edges of the layer(s) within the first electrodes 22 may reflect some radiation towards the edges 44, 74, 84, or 94 of the well structures 22, which in turn, may reflect radiation, such that the radiation propagates to interfaces of layer(s) within the first electrodes 22 at angles at less the critical angles. In one embodiment, the edge of the layer(s) within the first electrodes 22 underlie the receding edges of layer(s) within the well structures 42. In another embodiment, step-function edges 94 of the well structures 42 overlie the first electrodes 22. The presence of the edges of the layers within the first electrodes 22 and well structures 42 may change the angles of reflection along interfaces so that the radiation may "bounce around" the region where the well structures 42 overlie the first electrodes 22. Reflections from the interfaces may eventually allow some of the radiation to exit the user side of the electronic device.

Numbers for the refractive indices has been previously given with respect to layers previously described. Relative comparisons of refractive indices are given as they may also have an impact on the intensity for the halo effect. In one embodiment, the refractive index (indices) of one or more of the layer within the first electrodes 22 may have a value that is approximately 90 to 110% of one or more layers within the well structures 42. The refractive indices of one or more layers within the substrate 20 and the first electrodes 22 may be less than 90% of the refractive index of one or more layers within the well structures 42. In one specific embodiment, the substrate 20 includes glass ($\eta$ approximately 1.5), the first electrodes 22 include a silicon nitride layer 222 ($\eta$ approximately 2.0) and an ITO layer 224 ($\eta$ approximately 2.0), the well structures includes polyimide ($\eta$ approximately 2.0), the hole-transport layer 102 includes PEDOT ($\eta$ approximately 1.6), and the organic active layer 104 includes a polyfluorene compound (n approximately 1.6).

In another embodiment, the refractive index of a layer within the well structures 42 is closer to the refractive index of a layer within the first electrodes 22 as compared to the refractive indices of the substrate 20 and organic layers 100. Put in other terms, a first difference is the absolute value of the refractive index of a layer within the well structures 42 minus the refractive index of a layer within the organic layer 100. A second difference is the absolute value of the refractive index of a layer within the well structures 42 minus the refractive index of a layer within the first electrodes 22. A third difference is the absolute value of the refractive index of a layer within the well structures 42 minus the refractive index of a layer within the substrate 20. Each of the first and third differences is larger than the second difference. If radiation is to be emitted through the encapsulating layer (e.g., lid), the refractive index of a layer within the encapsulating layer would be similar to that of the layer within the substrate 20. The substrate 20 and encapsulating layer may be parts of environmental protection structures.

In one specific embodiment, the refractive indices of the layers within the first electrodes 22 and well structures 42 are substantially the same. In this embodiment, the interfaces between the first electrodes 22 and well structures 42 may be nearly transparent to radiation propagating between the first electrodes 22 and the well structures 42. Therefore, reflections at interfaces between the first electrodes 22 and well structures 42 may have an insignificant impact on radiation reflected or entering well structures 42 at the edges 44, 74, 84, or 94 and propagating towards the user side 204 of the electronic device.

The well structures 42 do not have overhanging projections, such as those described in U.S. Patent Application Publication 2002/0060518 A1. If the well structures 42 were to have overhanging projections, the reflection of the radiation near the edge of the well structures 42 may be adversely affected or otherwise have characteristics that vary from electronic device to electronic device due to variations in the shape of the overhanging projections.

6. Other Shapes and Patterns

Figure 15:
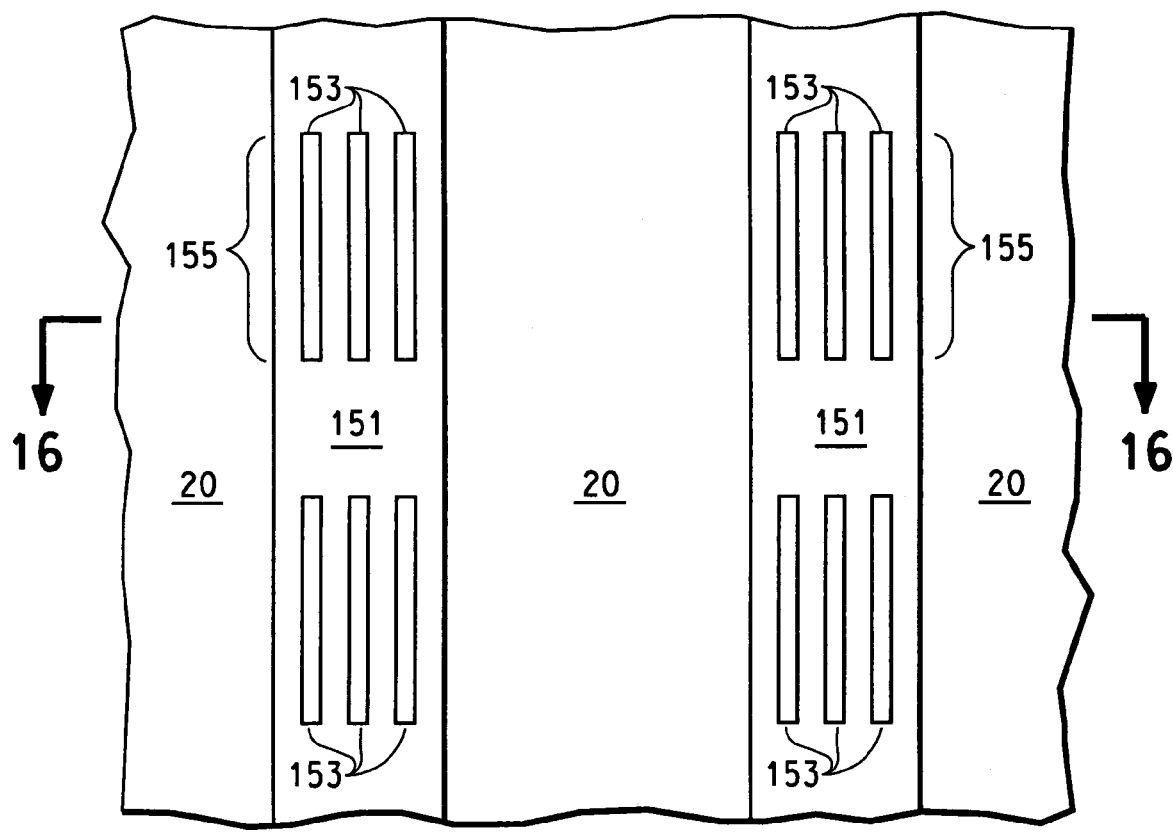
FIGS. 15 and 16 include illustrations of a plan view and a cross-sectional view, respectively, of a portion of an array within an electronic device after forming slotted first electrodes.
Figure 16:
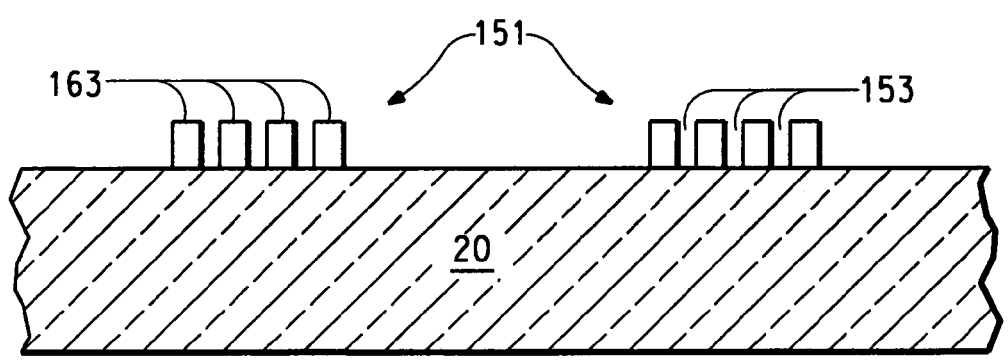
Figure 17:
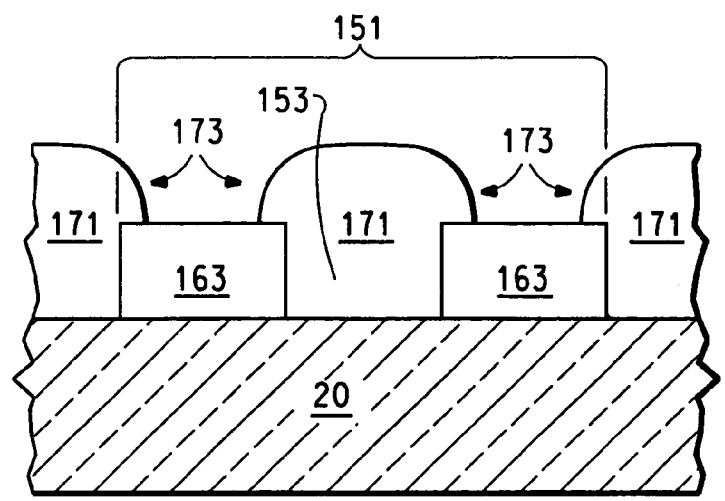
FIG. 17 includes an illustration of a cross-sectional view of an enlarged portion of FIG. 16 after forming well structures near the edge of a first electrode and within a slot.

FIGS. 15 to 17 illustrate another embodiment in which the first electrodes 151 include a pattern of slots 153 where radiation-emitting components 155 are being formed. FIG. 16 includes an illustration along sectioning line 16-16 in FIG. 15. In one embodiment, the first electrodes 151 includes layer 163. Within each radiation-emitting component, the first electrode 151 can be seen to include slots 153 that may or may not extend through the entire thickness of the layer for the first electrode. In one specific embodiment, the first electrode 151 includes an ITO layer 163. The thickness and formation of the ITO layer 163 may be similar to one described for first electrodes 22 except that the silicon nitride layer is not present. The materials that can be used for the first electrodes 151 may be any of those previously described for the first electrodes 22. Well structures 171 are formed similar to the process previously described with respect to well structures 42 as illustrated in FIGS. 4 to 6. Edges 173 have shapes similar to edges 44. In another embodiment, the well structures 171 may have edges similar to other embodiments previously described (e.g., FIGS. 7 to 9). The fabrication process starting with the organic layer 100 is similar to a prior embodiment previously described.

The presence of the slots 153 within the radiation-emitting components 151 may be used to help produce the halo effect within the radiation-emitting component itself rather than only near the perimeter of the radiation-emitting component. The widths of the slots 153 and remaining portions of the ITO layer 163 (adjacent to slots 153) within the radiation-emitting components 155 can be adjusted to achieve a high degree of the halo effect. For example, the widths of the slots 153, the widths of portions of the ITO layer 163 adjacent to the slots 153, or both may be in a range of approximately 2 to 50 microns. Referring to FIG. 14, the peak intensity is about 4 microns from the edge of the well structures 42. In one embodiment, each of the widths for the slots 153 and the potions of the ITO layer 163 between the slots may be in a range of approximately 5 to 15 microns. Note that the widths of the slots 153 and widths of the portions of the ITO layer 163 adjacent to the slots 153 may be the same or different. The slots 153 may have the same or different widths compared to one another. Similarly, the portions of the ITO layer 163 adjacent to the slots 153 may have the same or different widths compared to one another. The portions of the first electrodes 151 between radiation-emitting components 155 electrically connect the radiation-emitting components 155 to one another, and in one embodiment includes the ITO layer 163. The portions of the first electrodes 151 between radiation-emitting components 155 may or may not be slotted.

Figure 18:
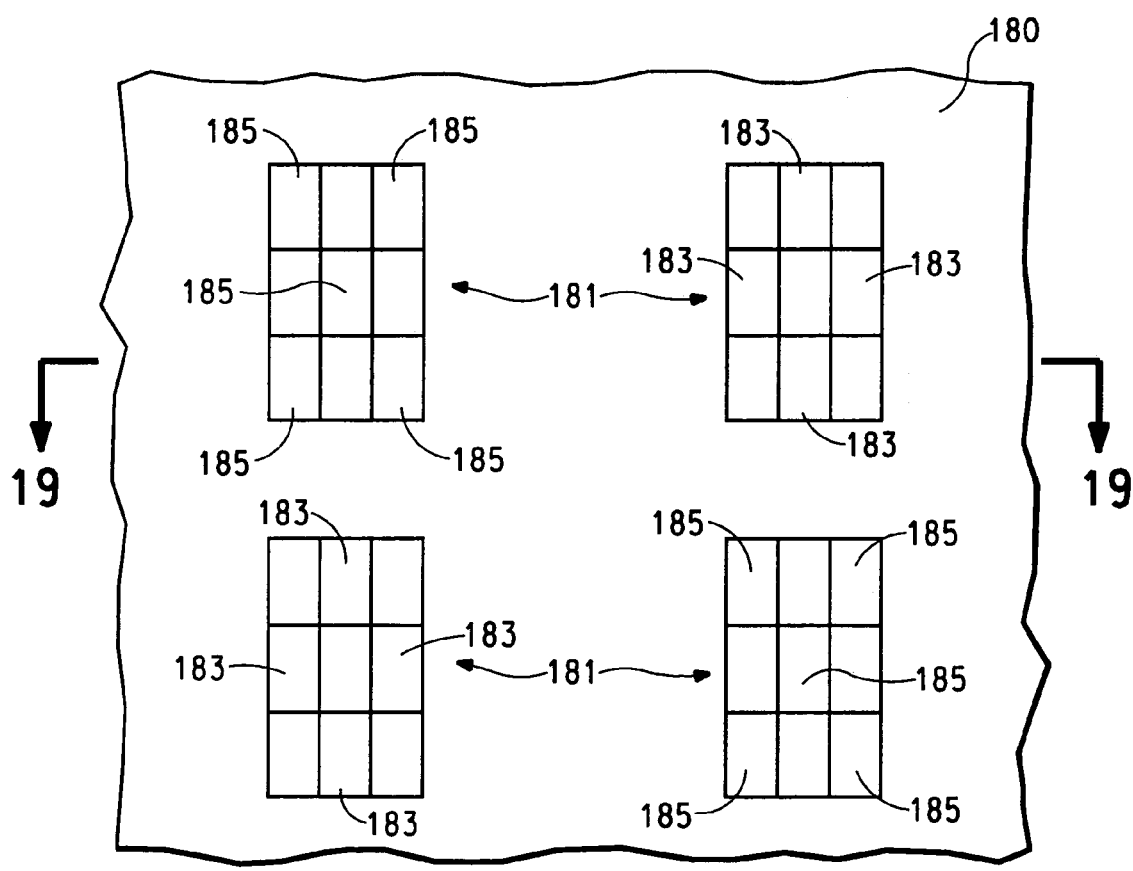
FIGS. 18 and 19 include illustrations of a plan view and a cross-sectional view, respectively, of a portion of an array within an electronic device after forming first electrodes having a checkerboard pattern.
Figure 19:
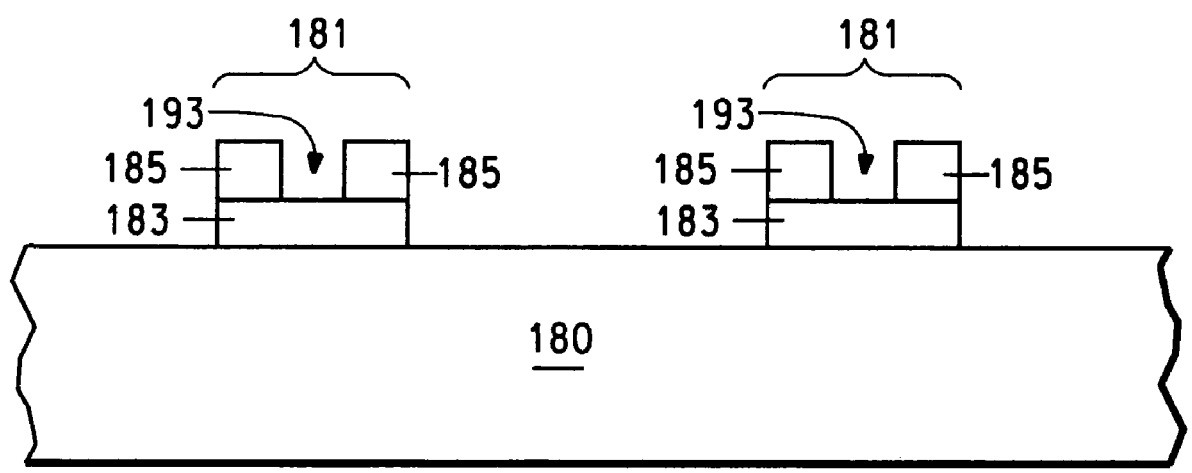

The shapes of features within the first electrodes is not limited to slots. FIGS. 18 and 19 include an illustration where a checkerboard pattern may be used. In one embodiment, an active matrix display may be formed. Although not shown, the substrate 180 can include circuitry used to drive the radiation-emitting components. In the embodiment, first electrodes 181 are not electrically connected to each other. Each of the first electrodes 181 includes a lower electrically conductive layer 183 and an upper electrically conductive layer 185. The lower electrically conductive layer 183 may have a thickness in a range of approximately 50 to 500 nm, and provide an electrical connection between the upper conductive layer 185 and the underlying circuitry (not shown) within the substrate 180. The lower conductive layer 183 may have a pattern that generally corresponds to the shape of the radiation-emitting component. The upper conductive layer 185 may include any of the electrically conductive materials and thicknesses given for the first anodes 22 previously described. In one embodiment, the upper conductive layer 185 has a checkerboard pattern. Portions of lower conductive layer 183 can be seen from a plan view where openings 193 lies between portions of the upper conductive layer 185. The well structures (not shown) can be formed using an embodiment as previously described. The rest of the electronic device starting with the well structures can be formed using any one or more of the embodiments previously described.

The checkerboard pattern as illustrated by FIGS. 18 and 19 has even more exposed surface area along sides of the upper conductive layer 185 compared to the slots 153 in FIGS. 15-17. In another alternative embodiment, layer 163 or 185 may be etched only through a part of its thickness.

In other embodiments, other shapes and other patterns may be used. The shapes, patterns, or both can increase the exposed surface area in which the well structures contact, rather that only being limited to the edge near the outer perimeter of the radiation-emitting component or well structure. Other shapes (e.g., circles, triangles, hexagons, etc. as seen from a plan view), other patterns, or a combination thereof may be used. After reading this specification, skilled artisans will be able to determine what shapes, patterns, pitches, and spacings should be used for their particular applications.

7. Other Embodiments

In another embodiment, a full-color active matrix display may be formed. Portions of the organic active layer 104 may selectively receive organic dye(s) using an inkjet to allow the different colors within a pixel (a collection of radiation-emitting components) to be realized. Alternatively, different organic active layers may be used for the different radiation-emitting components within a pixel. If an active matrix OLED display is being formed, thin-film circuits may be present with substrate 20. Such thin-film circuits are conventional.

In still other embodiments, the materials used for the first electrodes 22 and second electrodes 112 can be reversed. In this manner, the anodes and cathodes are effectively reversed (cathode closer to the user side 204 rather than the anode). Note that if the cathode lies closer to the user side, it may need to be substantially transparent to radiation emitted or received by the electronic device. Similarly, note that the embodiment described within FIGS. 15 to 21 may also have the electrodes reversed.

At least some of the embodiments described herein may improve radiation emission characteristics without an increase in size of the radiation-emitting components or power. Additionally, optical cross talk between radiation-emitting components may be reduced. Designs can be achieved that take advantage of the waveguide effect and redirect radiation that may otherwise propagate to other components or outside the viewing area of the display to be emitted within the viewing area of the display. Concepts described herein can be used to potentially create radiation-responsive components that may be more sensitive to radiation. Note that one or more of the advantages are not required for all embodiments.

EXAMPLES

The invention will be further described in the following examples, which do not limit the scope of the invention described in the claims.

Example 1

Figure 20:
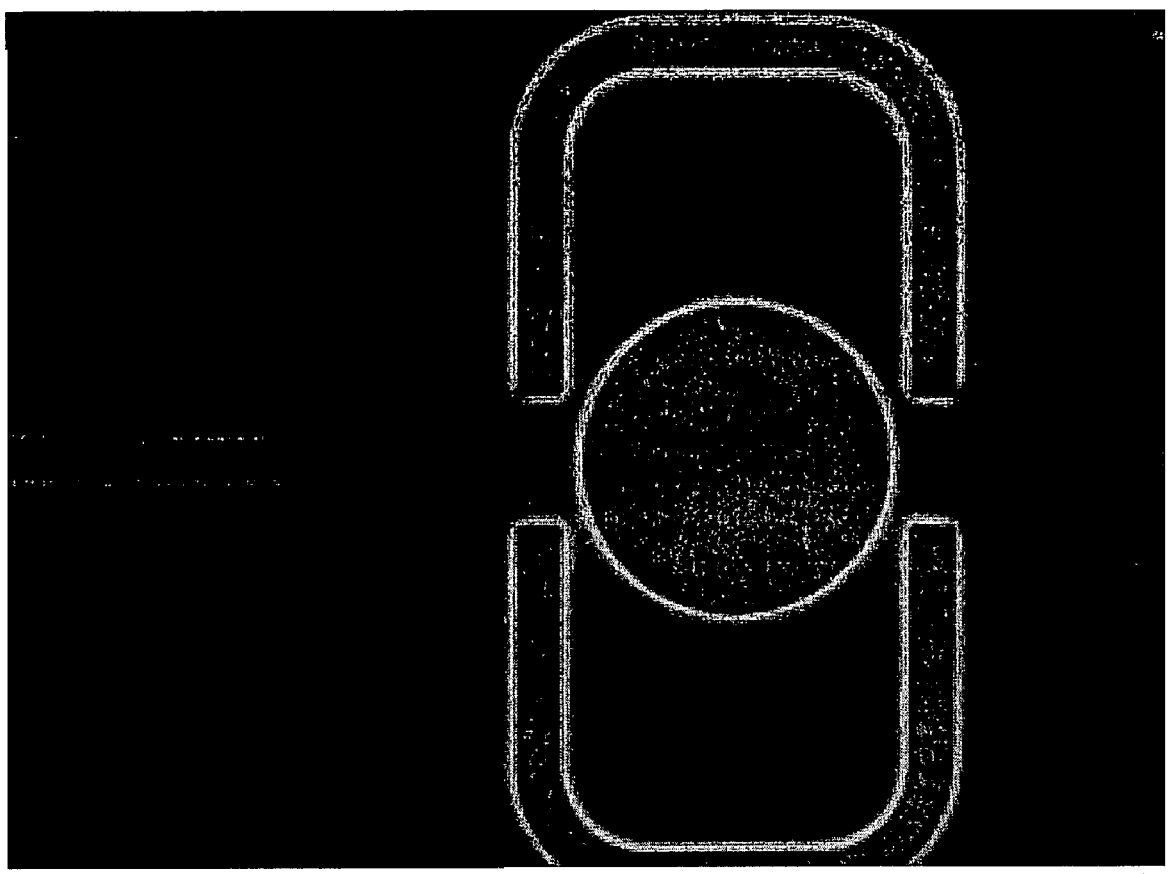
FIG. 20 includes an illustration of a plan view of radiation-emitting components having different shapes and corresponding halos for those radiation-emitting components.

This Example demonstrates that the effective aperture ratio (the emission area/radiation-emitting component area) can be larger than one. The process flow follows the process flow as previously described with respect to FIGS. 2 to 12. After forming the first electrodes 22, a photoresist layer (AZ 4110™ brand photoresist available from Clariant Corporation of Somerville, N.J., η approximately 2.0) is deposited to a thickness of approximately two microns over ITO (η approximately 2.0) of the first electrodes. The photoresist layer is patterned using a technique to produce a dome-type well structure, as seen from a cross-sectional view (both ends of topology). FIG. 5 includes an illustration of a similar electronic device at this point in the process flow. From a plan view of the electronic device, the well structures in Example 1 are different from FIG. 4. The well structures can include openings, such as lines, circles, and U-shaped openings. The shape of the well structure at the edge adjacent to the openings is similar to that illustrated in FIG. 6. The organic active layer includes a green light-emitting polymer for the OLEDs. After fabrication is completed, the electronic device is operated so that the OLEDs formed emit green light. The image seen by a user along the user side of the electronic device is illustrated in FIG. 20. There is strong emission ring (also called a "halo") surrounding the pattern defined by first electrodes. This emission ring overlaps layer(s) within the well structures. FIG. 14 illustrates the emission intensity distribution crossing the first electrode/well structure boundary. The emission intensity in the halo is approximately 50% stronger than that in the radiation-emitting component area. The ring extends into the well structures by approximately 10 microns. A reference device without the well structure can be made as a reference. In this case, the shape of the emitter is defined by ITO patterning. No emission ring (i.e., halo) near the edge of the radiation-emitting component is seen.

Example 2

This Example demonstrates that the halo effect is seen with other types of electronic devices that emit other wavelengths of radiation. An active matrix OLED is made with radiation-emitting component size of 80 radiation-emitting components per inch. The photoresist layer, such as the one used in Example 1, is used for the well structures and is formed on the first electrodes. The photoresist layer is patterned to achieve an oval shape. The topology of the photoresist layer near the edge is dome type, with tilted slope extending approximately 5 microns. See FIGS. 4 to 6. The organic active layer includes a blue light-emitting polymer. The halo effect, similar to that seen with Example 1, can be observed. A blue emission zone in the photoresist area can be seen along the user side of the electronic device. The intensity is stronger in the area where the photoresist layer of the well structure overlaps the first electrode than near a center of the radiation-emitting component. The width of the ring is approximately 5 microns. With both effective size improvement and the stronger intensity in the ring area, the total light output could be significantly higher than that without the patterned photoresist layer within the well structure.

Example 3

This Example demonstrates that each of the halos correspond to the radiation emitted from the radiation-emitting component that it surrounds. A full-color active matrix OLED display is made with a well structure surrounding each of the ITO anodes in the radiation-emitting component area. The radiation-emitting component size is approximately 85 micron by 255 micron. The well structures include openings that have an oval shape with width of approximately 60 microns. Emission rings of the same color can be observed surrounding each of the color pixels. In other words, a red halo surrounds a red radiation-emitting component, a green halo surrounds a green radiation-emitting component, and a blue halo surrounds a blue radiation-emitting component. Therefore, the halo is believed to originate from the radiation-emitting component it surrounds rather than from other nearby radiation-emitting components. The width of the ring was approximately 5 micron.

Note that not all of the activities described above in the general description or the examples are required, that a portion of a specific activity may not be required, and that one or more further activities may be performed in addition to those described. Still further, the order in which activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that one or more modifications or one or more other changes can be made without departing from the scope of the invention as set forth in the claims below. Accordingly, the specification and figures are to be regarded in an illustrative rather than a restrictive sense and any and all such modifications and other changes are intended to be included within the scope of invention.

Any one or more benefits, one or more other advantages, one or more solutions to one or more problems, or any combination thereof have been described above with regard to one or more specific embodiments. However, the benefit(s), advantage(s), solution(s) to problem(s), or any element(s) that may cause any benefit, advantage, or solution to occur or become more pronounced is not to be construed as a critical, required, or essential feature or element of any or all the claims.

It is to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

What is claimed is:

1. An electronic device including a radiation-emitting component or a radiation-responsive component, or a combination thereof, the electronic device comprising:
   a substrate;
   a first structure overlying the substrate, wherein the first structure is an electrically active structure;
   a second structure overlying at least portions of the first structure and the substrate, wherein:
      the second structure comprises a first layer;
      the first layer has a first refractive index; and
      the first layer comprises a first edge; and
   a second layer overlying at least portions of the first structure and the second structure, wherein:
      the second layer has a second refractive index that is lower than the first refractive index;
      the second layer includes a first portion and a second portion;
      the first portion of the second layer overlies both the first structure at the first edge and the second structure; and
      the second portion of the second layer overlies the first structure but not the second structure.

2. The electronic device of claim 1, wherein the second structure includes a well structure.

3. The electronic device of claim 1, wherein the first structure further comprises a third layer having a third refractive index, wherein:
   a first difference is an absolute value of the first refractive index minus the second refractive index;
   a second difference is an absolute value of the first refractive index minus the third refractive index; and
   the first difference is larger than the second difference.

4. The electronic device of claim 3, wherein:
   the substrate comprises a fourth layer having a fourth refractive index; and
   the fourth layer is optically coupled to the first layer, the second layer, and the third layer.

5. The electronic device of claim 1, wherein the first structure has a second edge, wherein the first layer overlies the second edge.

6. The electronic device of claim 5, wherein the first edge of the second structure includes a receding edge, wherein the receding edge overlies the second edge of the first structure.

7. The electronic device of claim 1, wherein the second layer comprises an organic active layer.

8. The electronic device of claim 1, wherein the second structure does not have en upper portion that is spaced apart and overhangs a lower portion of the second structure, wherein the lower portion lies between the upper portion and the substrate.

9. An electronic device comprising:
a substrate;
a first structure overlying the substrate, wherein:
the first structure comprises a first layer having a first refractive index, a perimeter and a pattern lying within the perimeter; and
the pattern extends at least partly through the first layer to define an opening with a first edge;
a second structure overlying the opening and at least portions of the first structure and the substrate, wherein:
the second structure comprises a second layer having a second refractive index
that comprises a second edge; and
a third layer having a third refractive index overlying at least portions of the first structure and the second structure, wherein:
the third layer includes a first portion and a second portion;
the first portion of the third layer overlies the first structure and the second structure at the second edge;
the second portion of the third layer overties the first structure but not the second structure and wherein:
a first difference is an absolute value of the first refractive index minus the second refractive index;
a second difference is an absolute value of the first refractive index minus the third refractive index; and
the first difference is larger than the second difference.

10. The electronic device of claim 9, wherein the second structure includes a well structure.

11. The electronic device of claim 9, wherein the third layer overlies the first edge.

12. The electronic device of claim 9, wherein the second edge of the second structure includes a receding edge, wherein the receding edge overlies the first edge of the first structure.

13. The electronic device of claim 9, wherein the third layer comprises an organic active layer.

* * * * *